United States Patent
Park et al.

(10) Patent No.: US 10,910,202 B2
(45) Date of Patent: Feb. 2, 2021

(54) PLASMA SENSING DEVICE, PLASMA MONITORING SYSTEM AND METHOD OF CONTROLLING PLASMA PROCESSES

(71) Applicant: SAMSUNG ELECTRONICS CO., LTD., Suwon-si (KR)

(72) Inventors: Hun-Yong Park, Seoul (KR); Sang-Woo Bae, Seoul (KR); Seul-Gi Lee, Cheongju-si (KR); Won-Don Joo, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 34 days.

(21) Appl. No.: 16/366,225

(22) Filed: Mar. 27, 2019

(65) Prior Publication Data

US 2020/0083030 A1 Mar. 12, 2020

(30) Foreign Application Priority Data

Sep. 7, 2018 (KR) .................. 10-2018-0107314

(51) Int. Cl.
*G01N 21/47* (2006.01)
*H01J 37/32* (2006.01)
*G01N 21/68* (2006.01)

(52) U.S. Cl.
CPC .... *H01J 37/32972* (2013.01); *G01N 21/4788* (2013.01); *G01N 21/68* (2013.01); *H01J 37/3299* (2013.01)

(58) Field of Classification Search
CPC ..... G01J 3/443; G01N 21/4788; G01N 21/68; H01J 37/32972; H01J 37/3299
See application file for complete search history.

(56) References Cited

U.S. PATENT DOCUMENTS 4,707,133 A 11/1987 Roberts et al.
5,888,337 A 3/1999 Saito
(Continued)

FOREIGN PATENT DOCUMENTS

JP 1994-243991 A 9/1994
JP 11-288921 A 10/1999
(Continued)

*Primary Examiner* — Hina F Ayub
(74) *Attorney, Agent, or Firm* — Lee IP Law, P.C.

(57) ABSTRACT

A plasma monitoring system includes a plasma chamber performing plasma processes, first and second plasma sensing devices, and a controller. The first and second plasma sensing devices are respectively in a first horizontal direction and a second horizontal direction perpendicular to each other from a center point of a monitoring plasma plane in the plasma chamber. The first and second plasma sensing device generate first and second detection signals with respect to the monitoring plasma plane based on a first incident beam radiated from the monitoring plasma plane in the first horizontal direction and a second incident beam radiated from the monitoring plasma plane in the second horizontal direction. The controller detects two-dimensional plasma distribution information with respect to the monitoring plasma plane by performing a convolution operation based on the first and second detection signals, and controls the plasma processes based on the two-dimensional plasma distribution information.

19 Claims, 19 Drawing Sheets

(56) References Cited

U.S. PATENT DOCUMENTS

| | | | |
|---|---|---|---|
| 9,874,524 B2 | 1/2018 | Cho et al. | |
| 2008/0010028 A1 | 1/2008 | Mazon et al. | |
| 2009/0127233 A1 | 5/2009 | Asano et al. | |
| 2017/0314991 A1 | 11/2017 | Meng et al. | |
| 2018/0204048 A1* | 7/2018 | Chefd'hotel | ......... G06K 9/0014 |
| 2019/0084507 A1* | 3/2019 | Nishijima | .......... G06K 9/00818 |

FOREIGN PATENT DOCUMENTS

| | | |
|---|---|---|
| JP | 2000-074755 A | 3/2000 |
| JP | 2008-298449 A | 12/2008 |
| KR | 10-2007-0003364 A | 1/2007 |
| KR | 10-2008-0086063 A | 9/2008 |
| KR | 10-2014-0097745 A | 8/2014 |
| KR | 10-2015-0133608 A | 11/2015 |
| KR | 10-1833763 B1 | 2/2018 |
| WO | WO 2006/067083 A1 | 6/2006 |

\* cited by examiner

PLASMA SENSING DEVICE, PLASMA MONITORING SYSTEM AND METHOD OF CONTROLLING PLASMA PROCESSES

CROSS-REFERENCE TO RELATED APPLICATION

Korean Patent Application No. 10-2018-0107314, filed on Sep. 7, 2018, in the Korean Intellectual Property Office (KIPO), and entitled: "Plasma Sensing Device, Plasma Monitoring System and Method of Controlling Plasma Processes," is incorporated by reference herein in its entirety.

BACKGROUND

1. Field

Example embodiments relate generally to plasma processing and, more particularly, to a plasma sensing device, a plasma monitoring system including the plasma sensing device and method of controlling plasma processes.

2. Description of the Related Art

Deposition and etching in a plasma environment are two of the most common plasma processes used to form patterned layers in integrated circuit manufacturing. Controls on chemical composition and impurity levels within a plasma chamber or a process chamber are crucial to the success of these processes. To ensure that a correct quantity of film is deposited or etched, the plasma state in the process chamber needs to be monitored during a plasma process. Optical emission spectrometer (OES) is a commercially available device used to detect the presence and relative concentrations of various gas species in a plasma chamber. For example, the OES may be used to determine a processing end-point. However, the OES typically provides characteristics of entire plasma in the plasma chamber, resulting in low sensitivity.

SUMMARY

According to example embodiments, a plasma monitoring system includes a plasma chamber, a first plasma sensing device, a second plasma sensing device and a controller. The plasma chamber performs plasma processes. The first plasma sensing device is in a first horizontal direction from a center point of a monitoring plasma plane in the plasma chamber, and generates a first detection signal with respect to the monitoring plasma plane based on a first incident beam radiated from the monitoring plasma plane in the first horizontal direction. The second plasma sensing device is in a second horizontal direction from the center point of the monitoring plasma plane, where the second horizontal direction is perpendicular to the first horizontal direction, and generates a second detection signal with respect to the monitoring plasma plane based on a second incident beam radiated from the monitoring plasma plane in the second horizontal direction. The controller detects two-dimensional plasma distribution information with respect to the monitoring plasma plane by performing a convolution operation based on the first detection signal and the second detection signal, and controls the plasma processes based on the two-dimensional plasma distribution information.

According to example embodiments, a plasma sensing device in a first horizontal direction from a center point of a monitoring plasma plane in a plasma chamber, includes, a beam receptor to filter an incident beam radiated from the monitoring plasma plane in the first horizontal direction to generate a line beam corresponding to the monitoring plasma plane, a splitter to split the line beam to generate two split line beams. a one-dimensional detector to generate intensity data based on one of the two split line beams, the intensity data representing one-dimensional entire intensity distribution according to a position on the monitoring plasma plane in a second horizontal direction perpendicular to the first horizontal direction, a diffraction grating to divide the other of the two split line beams to generate per-wavelength diffraction beams, and an image sensor to generate spectrum data based on the per-wavelength diffraction beams, the spectrum data representing one-dimensional per-wavelength intensity distributions according to the position on the monitoring plasma plane in the second horizontal direction.

According to example embodiments, a method of controlling plasma processes includes generating a first detection signal with respect to a first horizontal direction from a center point of a monitoring plasma plane based on a first incident beam radiated from the monitoring plasma plane in the first horizontal direction, generating a second detection signal with respect to a second horizontal direction from the center point of the monitoring plasma plane based on a second incident beam radiated from the monitoring plasma plane in the second horizontal direction, the second horizontal direction being perpendicular to the first horizontal direction, detecting two-dimensional plasma distribution information with respect to the monitoring plasma plane by performing a convolution operation based on the first detection signal and the second detection signal, and controlling plasma processes of the plasma chamber based on the two-dimensional plasma distribution information.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
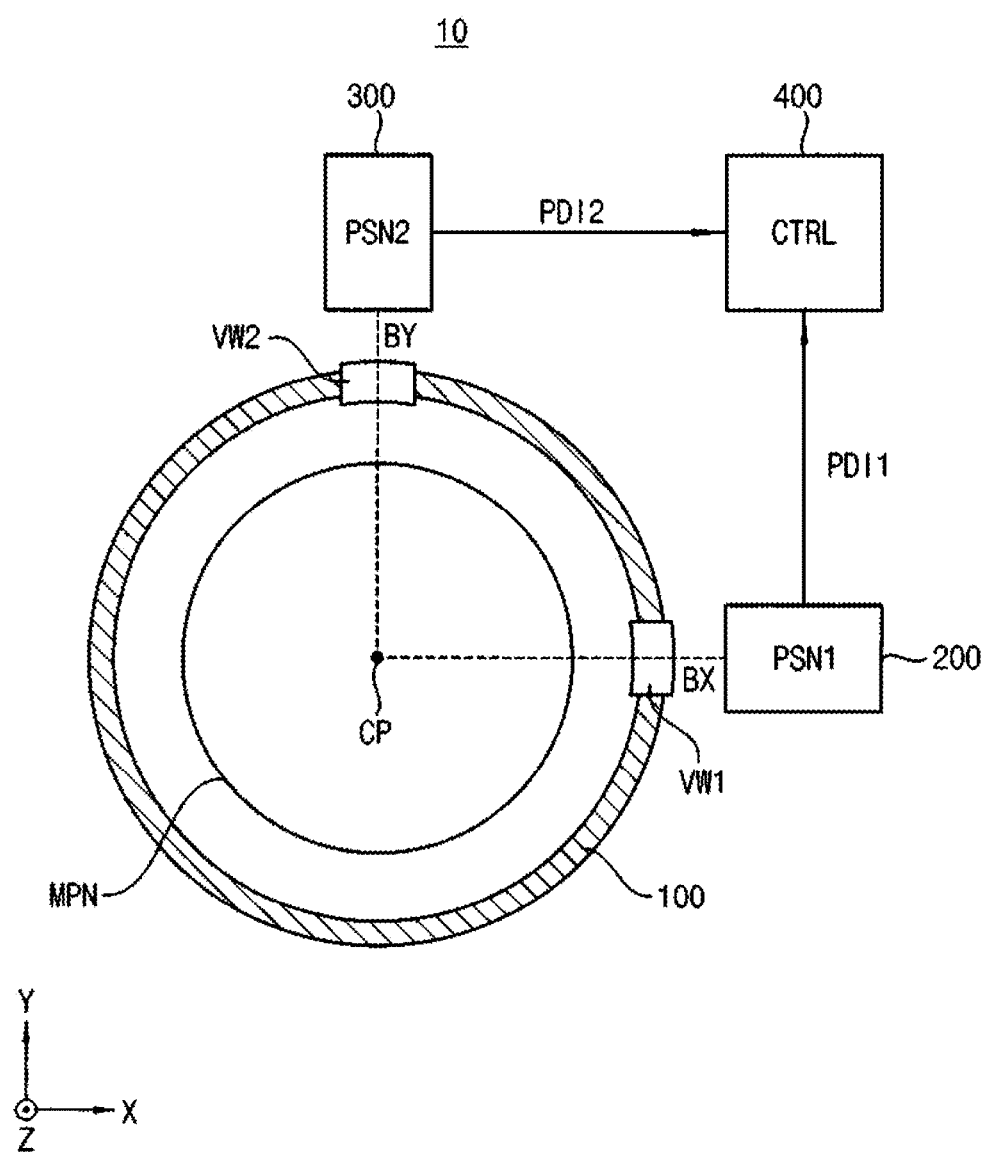
FIG. 1 illustrates a diagram of a plasma monitoring system according to example embodiments.

Various example embodiments will be described more fully hereinafter with reference to the accompanying drawings, in which some example embodiments are shown. In the drawings, like numerals refer to like elements throughout. The repeated descriptions may be omitted.

Example embodiments are described using an orthogonal set of an X-axis, a Y-axis, and a Z-axis for convenience of illustration and description. The X-axis, the Y-axis, and the Z-axis are used to three perpendicular directions along the three directions, and are not limited to particular directions.

The X direction corresponds to a first horizontal direction, the Y direction corresponds to a second horizontal direction and the Z direction corresponds to a vertical direction. If exceptional descriptions are not mentioned, the Z direction indicates a vertical direction perpendicular to a surface of a wafer in a plasma chamber, or perpendicular to a monitoring plasma plane. In this disclosure, X, Y, and Z may be used to indicate directions and alternatively positions or coordinates in the corresponding directions.

Figure 2:
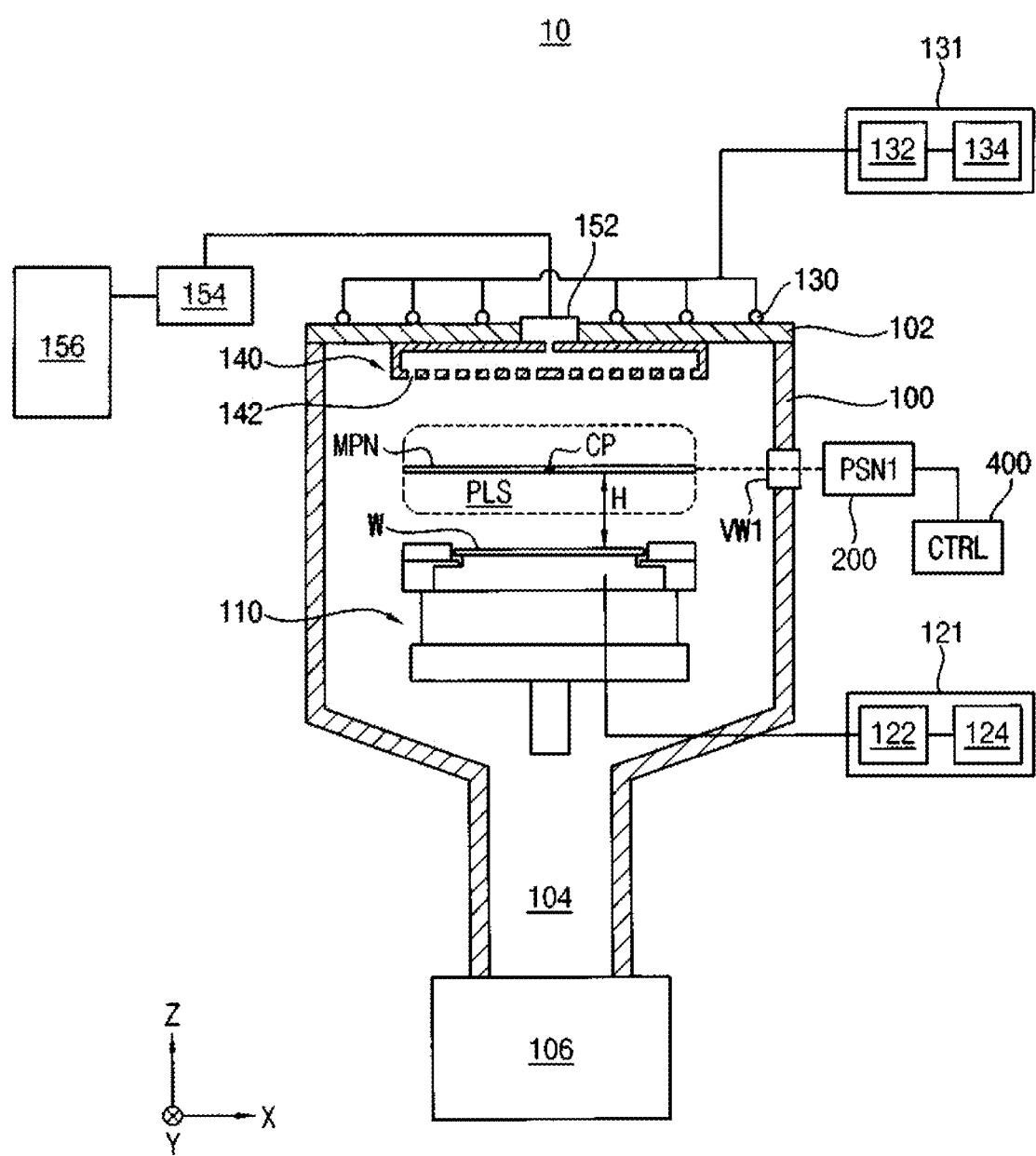
FIG. 2 illustrates a cross-sectional view of a plasma monitoring system according to example embodiments.

FIG. 1 is a diagram illustrating a plasma monitoring system according to example embodiments, and FIG. 2 is a cross-sectional view of a plasma monitoring system according to example embodiments. Referring to FIGS. 1 and 2, a plasma monitoring system 10 may include a plasma chamber 100, a first plasma sensing device PSN1 200, a second plasma sensing device PSN2 300, and a controller CTRL 400.

The first plasma sensing device 200 is positioned in a first horizontal direction X from a center point CP of a monitoring plasma plane MPN in the plasma chamber 100. The second plasma sensing device 300 is positioned in a second horizontal direction Y from the center point CP of the monitoring plasma plane MPN. In other words, the first plasma sensing device 200 and the second plasma sensing device 300 are positioned perpendicular to each other from the center point CP of the monitoring plasma plane MPN. Viewing windows VW1 and VW2 may be provided corresponding to the perpendicular positions.

The first plasma sensing device 200 generates a first detection signal PDI1 with respect to the monitoring plasma plane MPN based on a first incident beam BX radiated from the monitoring plasma plane MPN in the first horizontal direction X. The first detection signal PDI1 may represent a one-dimensional plasma distribution according to a position Y on the monitoring plasma plane MPN in the second horizontal direction Y.

The second plasma sensing device 300 generates a second detection signal PDI2 with respect to the monitoring plasma plane MPN based on a second incident beam BY radiated from the monitoring plasma plane MPN in the second horizontal direction Y. The second detection signal PDI2 may represent a one-dimensional plasma distribution according to a position X on the monitoring plasma plane MPN in the first horizontal direction X.

Each of the first detection signal PDI1 and the second detection signal PDI2 may include intensity data and spectrum data. The intensity data may represent one-dimensional entire intensity distribution according to each of a position X in the first horizontal direction X and a position Y in the second horizontal direction Y on the monitoring plasma plane MPN. The spectrum data may represent one-dimensional per-wavelength intensity distributions according to each of the position X in the first horizontal direction X and the position Y in the second horizontal direction Y on the monitoring plasma plane MPN. The one-dimensional plasma distributions of the first detection signal PDI1 and the second detection signal PDI2 will be described with reference to FIGS. 10, 11, and 12.

To provide the first detection signal PDI1 and the second detection signal PDI2, each of the first plasma sensing device 200 and the second plasma sensing device 300 may include a beam receptor, a splitter, a one-dimensional detector, and a two-dimensional detector. The two-dimensional detector may include a diffraction grating and an image sensor. These will be described with reference to FIGS. 3 to 6.

A beam receptor may filter each of the first incident beam BX and the second incident beam BY to generate a line beam corresponding to the monitoring plasma plane MPN. The splitter split the line beam to generate two split line beams. The one-dimensional detector may generate the intensity data based on one of the two split line beams. The intensity data may represent the one-dimensional entire intensity distribution according to each position on the monitoring plasma plane MPN in each of the first horizontal direction X and the second horizontal direction Y. The diffraction grating may divide the other of the two split line beams to generate per-wavelength diffraction beams. The image sensor may generate the spectrum data based on the per-wavelength diffraction beams. The spectrum data may represent the one-dimensional per-wavelength intensity distributions according to each position on the monitoring plasma plane MPN in each of the first horizontal direction X and the second horizontal direction Y.

The controller 400 may detect two-dimensional plasma distribution information with respect to the monitoring plasma plane MPN by performing a convolution operation based on the first detection signal PDI1 and the second detection signal PDI2. The controller may control the plasma processes of the plasma chamber 100 based on the two-dimensional plasma distribution information.

In some example embodiments, the first detection signal PDI1 may include first intensity data representing one-dimensional entire intensity distribution according to the position Y on the monitoring plasma plane MPN in the second horizontal direction Y, and the second detection signal PDI2 may include second intensity data representing one-dimensional entire intensity distribution according to the position X on the monitoring plasma plane MPN in the first horizontal direction X. In this case, the controller 400 may generate, as the two-dimensional plasma distribution information, two-dimensional entire intensity distribution of entire gas species in the monitoring plasma plane MPN by performing a convolution operation based on the first intensity data and the second intensity data.

In some example embodiments, the first detection signal PDI1 may include first spectrum data representing one-dimensional per-wavelength intensity distributions according to the position Y on the monitoring plasma plane MPN in the second horizontal direction Y, and the second detection signal PDI2 may include second spectrum data representing one-dimensional per-wavelength intensity distributions according to the position X on the monitoring plasma plane MPN in the first horizontal direction X. In this case, the controller 400 may generate, as the two-dimensional plasma distribution information, two-dimensional per-wavelength intensity distributions of respective gas species in the monitoring plasma plane MPN by performing a convolution operation based on the first spectrum data and the second spectrum data.

As such, the plasma sensing device and the plasma monitoring system including the plasma sensing device according to example embodiments may enhance productivity of the plasma processes by providing two-dimensional or three-dimensional plasma distribution information in real time using orthogonality of the detection signals.

As illustrated in FIG. 2, the plasma monitoring system 10 may include a support 110 having a lower electrode, an upper electrode 130, and a shower head 140 included in the plasma chamber 100.

The support 110 may support a target, e.g. a wafer W, within the plasma chamber 100. The support 110 may include a stage having the lower electrode on which the target is disposed.

In example embodiments, the plasma monitoring system 10 may be an apparatus to process plasma on a surface of the target, e.g., a substrate or wafer W, in the plasma chamber 100 to form a dangling bond on the surface of the substrate. Plasma generated by the plasma monitoring system 10 may include inductively coupled plasma, capacitively-coupled plasma, microwave plasma, etc.

The plasma chamber 100 may provide a sealed space, e.g., a vacuum sealed space, where a plasma etch process is performed on the wafer W. The plasma chamber 100 may be a cylindrical vacuum chamber. The plasma chamber 100 may include a cover 102 which covers an open upper end portion of the plasma chamber 100. The cover 102 may air-tightly seal, e.g., vacuum seal, the upper end portion of the plasma chamber 100.

A gate for opening and closing a loading/unloading port of the wafer W may be provided in a sidewall of the plasma chamber 100. The wafer W may be loaded/unloaded onto/from the substrate stage through the gate.

A gas exhaust port 104 may be provided in a bottom portion of the plasma chamber 100, and a gas exhaust unit 106 may be connected to the gas exhaust port 104 through a gas exhaust line. The gas exhaust unit 106 may include a vacuum pump such as a turbo-molecular pump or the like, to control a pressure of the plasma chamber 100 so that the processing space inside the plasma chamber 100 may be depressurized to a desired vacuum level. Additionally, by-products of the process and residual process gases may be discharged through the exhaust port 104.

The upper electrode 130 may be outside the plasma chamber 100 such that the upper electrode 130 faces the lower electrode in the support 110. The upper electrode 130 may be on the cover 102. Alternatively, the upper electrode 130 may be disposed over the shower head 140 within the plasma chamber 100 or in an upper portion of the plasma chamber 100.

The upper electrode 130 may include a radio frequency antenna. The radio frequency antenna may have a plan coil shape. The cover 102 may include a circular plate shaped dielectric window. The dielectric window may include a dielectric material. For example, the dielectric window may include alumina ($Al_2O_3$). Power from the antenna may be transferred into the chamber 100 through the dielectric window.

For example, the upper electrode 130 may include coils having a spiral shape or a concentric shape. The coil may generate inductively coupled plasma P in a space of the plasma chamber 100. The coils may have various configurations with respect to the number, arrangement, etc.

In example embodiments, the plasma monitoring system 10 may further include a gas supply unit connected to the shower head to supply a gas into the plasma chamber 100. For example, the gas supply unit may include a gas supply line 152, a flow controller 154, and a gas supply source 156. The gas supply line 152 may be connected to an inner space of the shower head 140 within the plasma chamber 100.

The shower head 140 may be arranged over the support 110 to face the entire surface of the wafer W, and may spray out a plasma gas onto the surface of the wafer W through discharge holes 142. For example, the plasma gas may include a gas, e.g., $O_2$, $N_2$, $Cl_2$, etc.

The gas supply source 156 may store the plasma gas, which may be supplied into the plasma chamber 100 through the shower head connected to the gas supply line 152. The flow controller 154 may control an amount of the gas supplied into the plasma chamber 100 through the gas supply line 152. For example, the flow controller 154 may include a mass flow controller (MFC).

A first power supply 131 may apply a plasma source power to the upper electrode 130. For example, the first power supply 131 may include a source RF power source 134 and a source RF matcher 132, such as plasma source elements. The source RF power source 134 may generate an RF signal. The source RF matcher 132 may match impedance of the RF signal generated by the source RF power source 134, e.g., using the coils to control generation of plasma.

The second power supply 121 may apply a bias source power to the lower electrode in the support 100. For example, the second power supply 121 may include a bias RF power supply 124 and a bias RF matcher 122. The bias RF power source 124 may generate an RF signal. The bias RF matcher 122 may match impedance of the bias RF signal by controlling bias voltage and bias current applied to the lower electrode. The bias RF power source 124 and the source RF power source 124 may be synchronized or desynchronized each other through a synchronizer of the controller 400.

The controller 400 may be connected to the first power supply 131 and the second power supply 121 to control operations thereof. The controller 400 having a microcomputer and various interface circuits may control an operation of the plasma monitoring system 10 based on programs and recipe information stored in an external or internal memory.

When the radio frequency power having a predetermined frequency is applied to the upper electrode 130, an electromagnetic field induced by the upper electrode 130 is applied to a source gas supplied within the plasma chamber 100 to generate plasma PLS. As the bias power having a predetermined frequency less than the frequency of the plasma power is applied to the lower electrode, plasma atoms or ions generated within the plasma chamber 100 may be attracted toward the lower electrode of the support 110.

In example embodiments, the plasma monitoring system 10 may perform a local plasma process on a surface of the wafer W. The plasma monitoring system 10 may perform the plasma process with different plasma densities along at least circumferential direction about a center with respect to the surface of the wafer W.

In particular, the plasma monitoring system 10 may process with a first plasma density in a first direction from the center of the wafer W and process with a second plasma density in a second direction oriented to the first direction at a predetermined angle along the circumferential direction about the center of the wafer W.

In this disclosure, the monitoring plasma plane MPN is a planar portion of the plasma space PLS to be monitored. The monitoring plasma plane MPN may be a very thin space having a form of a plate. The thickness of the monitoring plasma plane MPN may be determined depending on performance or resolution of the plasma sensing device. The center point CP of the monitoring plasma plane MPN may overlap and be spaced from the center of the wafer W along the vertical direction Z. The monitoring plasma plane MPN may extends further along the first horizontal direction X and the second horizontal direction Y than the wafer W.

As illustrated in FIG. 2, the first plasma sensing device 200 and the second plasma sensing device 300 may be arranged at the same height or the same vertical level H in the vertical direction Z as the monitoring plasma plane MPN. In some example embodiments, the vertical level H of the monitoring plasma plane MPN may be fixed. In some example embodiments, the vertical level H of the monitoring plasma plane MPN may be varied.

Figure 3:
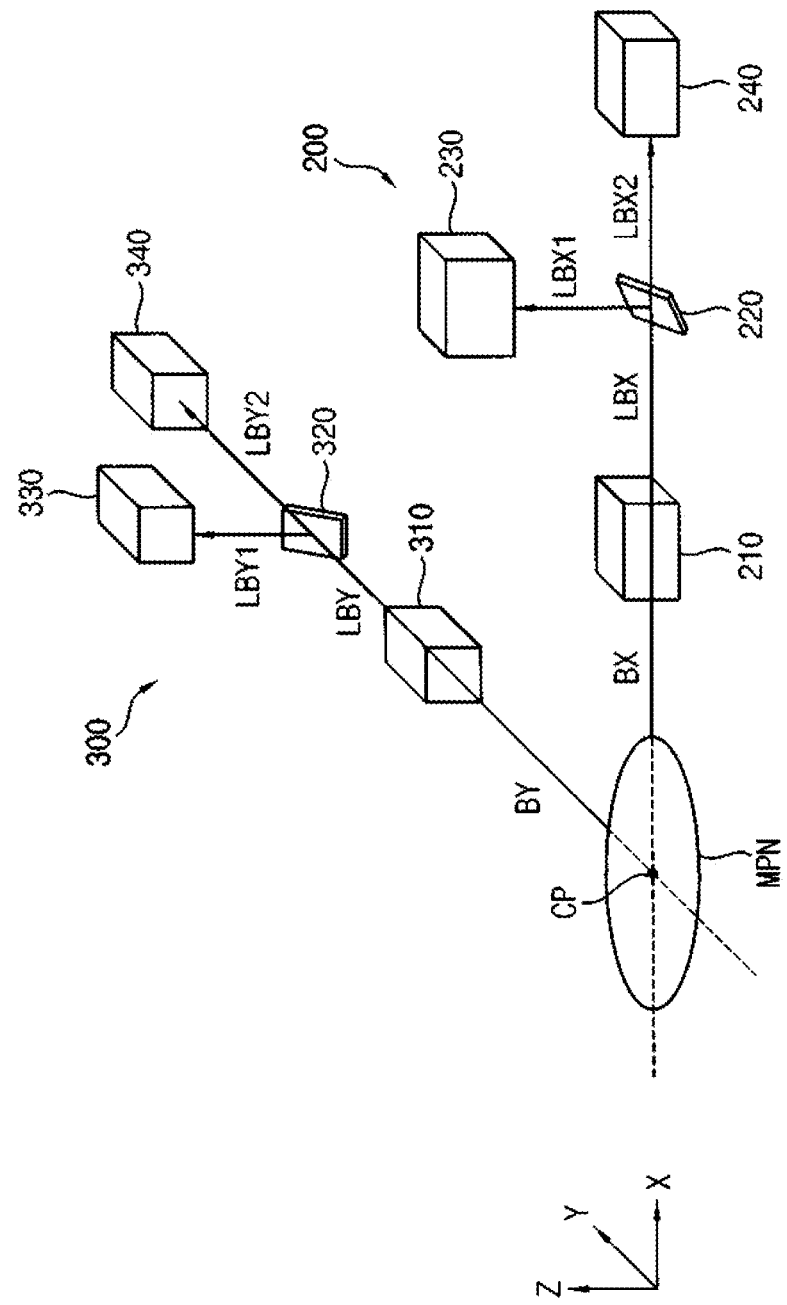
FIG. 3 illustrates a perspective view of a plasma monitoring system according to example embodiments.
Figure 4:
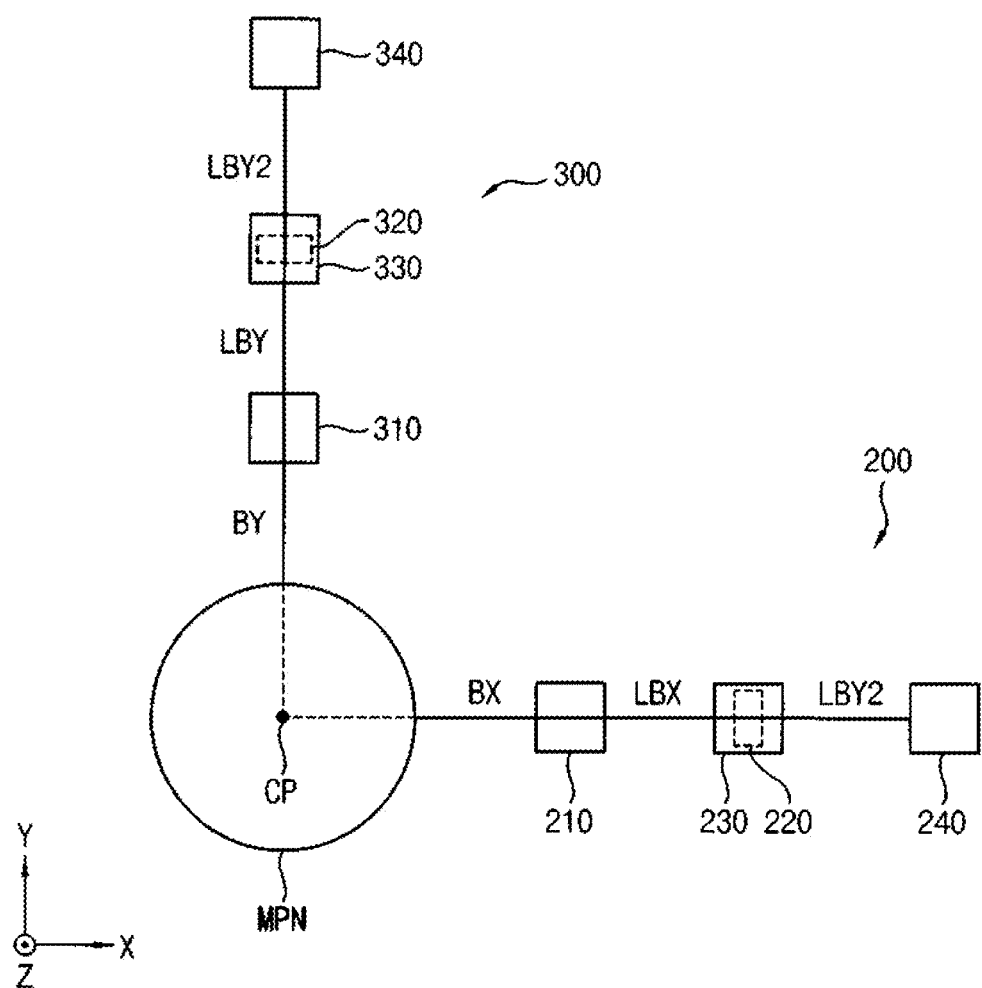
FIG. 4 illustrates a plan view of the plasma monitoring system of FIG. 3.
Figure 5:
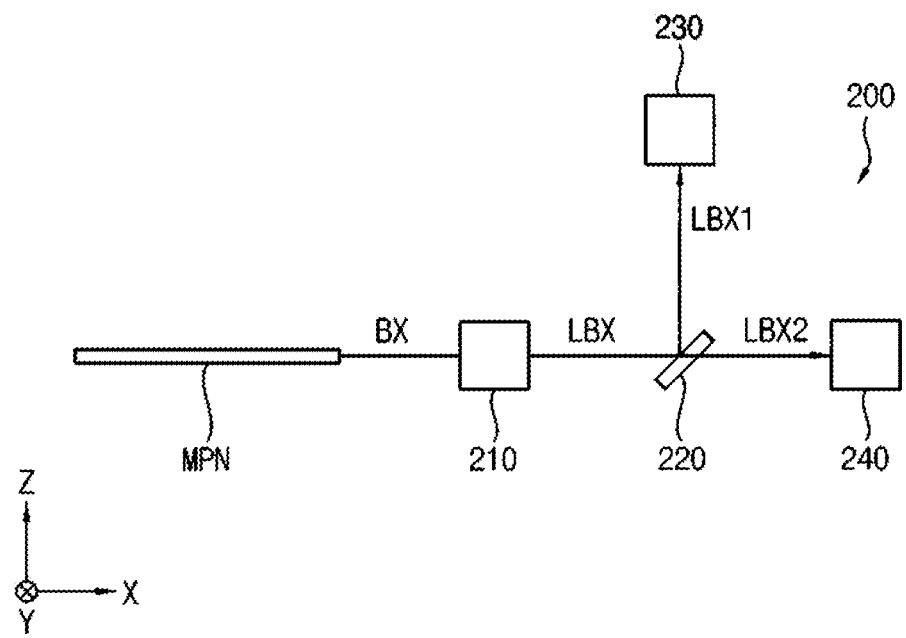
FIGS. 5 and 6 illustrate lateral views of the plasma monitoring system of FIG. 3.
Figure 6:
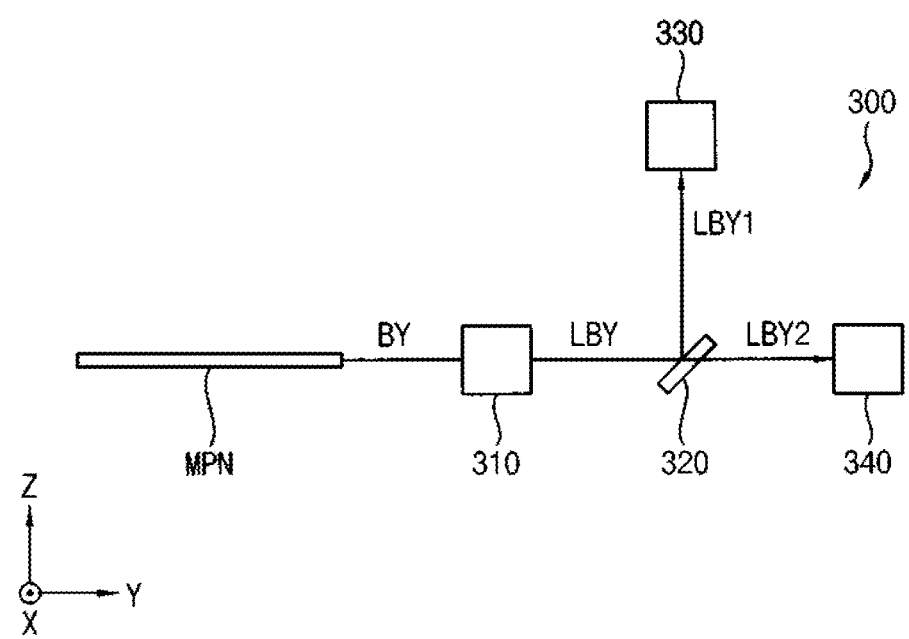

FIG. 3 is a perspective view of a plasma monitoring system according to example embodiments. FIG. 4 is a plan view of the plasma monitoring system of FIG. 3. FIGS. 5 and 6 are lateral views of the plasma monitoring system of FIG. 3. For convenience of illustration, the first plasma sensing device 200 and the second plasma sensing device 300 are illustrated in FIGS. 3 through 6, and other components are omitted.

Referring to FIGS. 3 through 6, a plasma monitoring system may include a first plasma sensing device 200 and a second plasma sensing device 300.

The first plasma sensing device 200 may include a first beam receptor 210, a first splitter 220, a first one-dimensional detector 230, and a first two-dimensional detector 240.

The first beam receptor 210 may filter a first incident beam BX radiated from the monitoring plasma plane MPN in the first horizontal direction X to generate a first line beam LBX corresponding to the monitoring plasma plane MPN. The first splitter 220 may split the first line beam LBX to generate a first split line beam LBX1 and a second split line beam LBX2. The first one-dimensional detector 230 may generate first intensity data based on the first split line beam LBX1, where the first intensity data represent one-dimensional entire intensity distribution according to a position Y on the monitoring plasma plane MPN in the second horizontal direction Y. The first two-dimensional detector 240 may generate first spectrum data based on the second split line beam LBX2, where the first spectrum data represent one-dimensional per-wavelength intensity distributions according to a position Y on the monitoring plasma plane MPN in the second horizontal direction Y.

The second plasma sensing device 300 may include a second beam receptor 310, a second splitter 320, a second one-dimensional detector 330 and a second two-dimensional detector 340.

The second beam receptor 310 may filter the second incident beam BY radiated from the monitoring plasma plane MPN in the second horizontal direction Y to generate a second line beam LBY corresponding to the monitoring plasma plane MPN. The second splitter 320 may split the second line beam LBY to generate a third split line beam LBY1 and a fourth split line beam LBY2. The second one-dimensional detector 330 may generate second intensity data based on the third split line beam LBY1, where the second intensity data represent one-dimensional entire intensity distribution according to a position X on the monitoring plasma plane MPN in the first horizontal direction X. The second two-dimensional detector 340 may generate second spectrum data based on the fourth split line beam LBY2, where the second spectrum data represent one-dimensional per-wavelength intensity distributions according to the position X on the monitoring plasma plane MPN in the first horizontal direction X.

Figure 7:
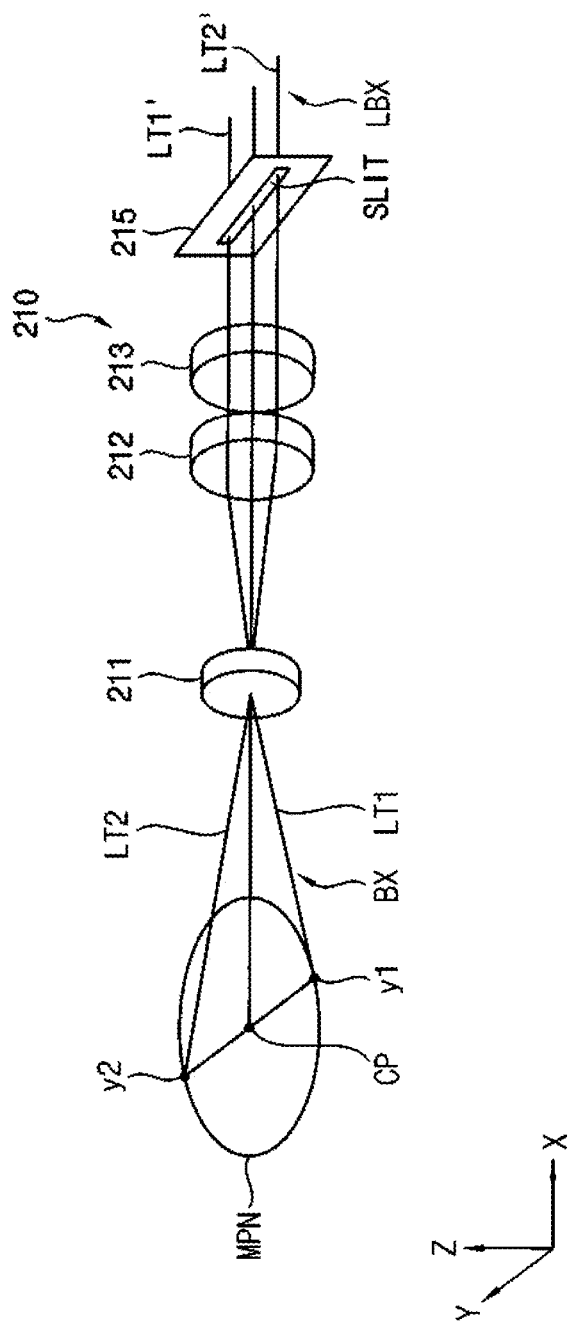
FIG. 7 illustrates a perspective view of an example embodiment of a beam receptor included in the plasma sensing device according to example embodiments.
Figure 8:
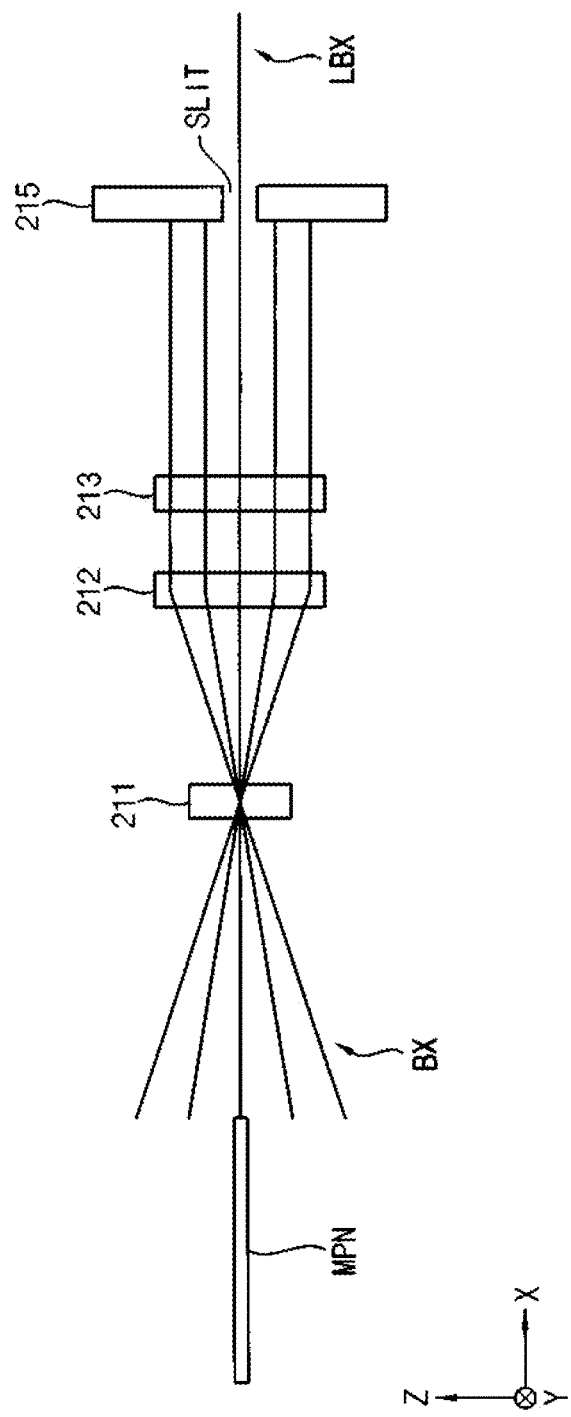
FIG. 8 illustrates a lateral view of the beam receptor of FIG. 7.

FIG. 7 is a perspective view of an example embodiment of a beam receptor included in the plasma sensing device according to example embodiments, and FIG. 8 is a lateral view of the beam receptor of FIG. 7. FIGS. 7 and 8 illustrate, as an example, the first beam receptor 210. The second beam receptor 310 may have the same configuration as the first beam receptor of FIGS. 7 and 8.

Referring to FIGS. 7 and 8, the first beam receptor 210 may include a first lens unit to concentrate the first incident beam BX and a first filter 215. The first lens unit may include one or more lenses 211, 212 and 213. The lenses 211, 212 and 213 may be a various combination of a convex lens, a concave lens, a Fresnel lens, a Meta lens, etc. The first filter 215 may have a slit to pass the first line beam LBX corresponding to the monitoring plasma plane MPN from a concentrated line beam from the first lens unit.

The lenses 211, 212 and 213 may have a wide beam-acceptance angle to receive light corresponding to a diameter y1~y2 of the monitoring plasma plane MPN in the second horizontal direction Y. The slit may extend in the second horizontal direction Y and have a thin width in the vertical direction Z. The length in the second horizontal direction Y of the slit may be determined to correspond to light LT1 and LT1' radiated from one end point y1 of the diameter y1~y2 of the monitoring plasma plane MPN and light LT2 and LT2' radiated from the other end point y2 of the diameter y1~y2 of the monitoring plasma plane MPN. As illustrated in FIG. 8, the width in the vertical direction Z of the slit may be determined so that light radiated from the monitoring plasma plane MPN may pass through the slit and the lights radiated from portions over and below the monitoring plasma plane MPN may be blocked by the first filter 215.

The second beam receptor 310 may have the same configuration as the first beam receptor 210 of FIGS. 7 and 8. That is, the second beam receptor 310 may include a first lens unit to concentrate the second incident beam BY and a second filter. The second lens unit may include one or more lenses, which may be a various combination of a convex lens, a concave lens, a Fresnel lens, a Meta lens, etc. The second filter may have a slit to pass the second line beam LBY corresponding to the monitoring plasma plane MPN among a concentrated beam from the second lens unit.

The lenses of the second lens unit may have a wide beam-acceptance angle to receive lights corresponding to a diameter of the monitoring plasma plane MPN in the first horizontal direction X. The slit of the second filter may extend in the first horizontal direction X and have a thin width in the vertical direction Z. The length in the first horizontal direction X of the slit of the second filter may be determined to correspond to a light radiated from one end point of the diameter of the monitoring plasma plane MPN in the first horizontal direction X and a light radiated from the other end point of the diameter of the monitoring plasma plane MPN in the first horizontal direction X. As described with reference to FIG. 8, the width in the vertical direction Z of the slit of the second filter may be determined so that lights radiated from the monitoring plasma plane MPN may pass through the slit and light radiated from portions over and below the monitoring plasma plane MPN may be blocked by the second filter.

Figure 9:
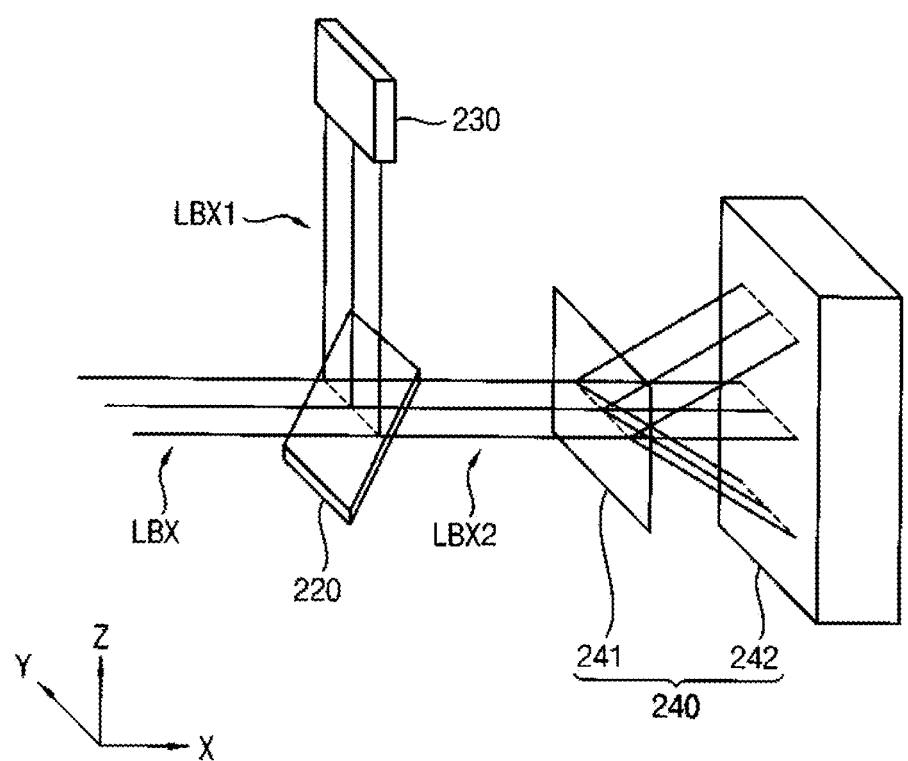
FIG. 9 illustrates a diagram of a plasma sensing device according to example embodiments.

FIG. 9 illustrates, as an example, further components of the first plasma sensing device 200. The corresponding components of the second plasma sensing device 300 may have the same configuration as the first plasma sensing device 200 of FIG. 9.

Referring to FIGS. 3 to 6 and 9, in addition to the first beam receptor 210 of FIGS. 7 and 8, the first plasma sensing device 200 may include the first splitter 220, the first one-dimensional detector 230 and the first two-dimensional detector 240.

The first splitter 220 may split the first line beam LBX to generate the first split line beam LBX1 and the second split line beam LBX2. In some example embodiments, the first splitter 220 may be implemented as a beam splitter. The beam splitter is an optical device, e.g., a half mirror, a prism, etc. to transmit a portion of an incident beam and reflect the other portion of the incident beam. These portions may have the same intensity or different intensities. The beam splitter may include an optical device that provides two output beams having perpendicular oscillating directions using birefringence.

The first one-dimensional detector 230 may generate the first intensity data based on the first split line beam LBX1, where the first intensity data represent one-dimensional entire intensity distribution according to the position Y on the monitoring plasma plane MPN in the second horizontal direction Y. The first one-dimensional detector 230 may include a line sensor. The line sensor may be implemented photo-detectors or pixels arranged in a row. Also, the line sensor may include two or more rows of pixels. In this case, the pixels of the same column are combined to provide information of one coordinate.

The first two-dimensional detector 240 may include a first diffraction grating 241 and a first image sensor 242.

The first diffraction grating 241 may divide the second split line beam LBX2 to generate first per-wavelength diffraction beams. A diffraction grating is an optical component that splits and diffracts light into lights beams of different wavelengths traveling in different directions. The diffraction grating includes a plurality of parallel lines or gratings of the same pitch. Using the pitch of the grating and different diffraction angles depending on a wavelength of an incident beam, the incident beam may be divided into spectrum components, i.e., the diffraction beams corresponding to different wavelengths of the incident beam.

Figure 11:
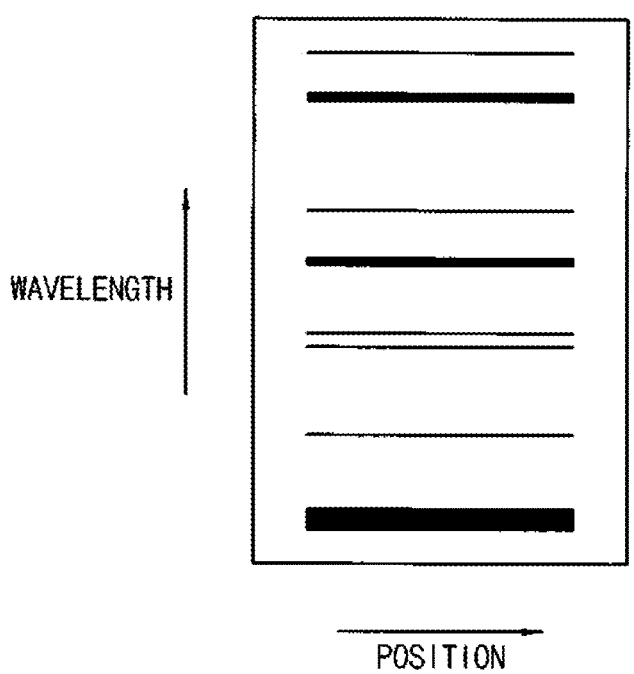
FIG. 11 illustrates a diagram of an example of a spectrum image generated by a two-dimensional detector included in a plasma sensing device according to example embodiments.

The first image sensor 242 may generate the first spectrum data based on the first per-wavelength diffraction beams, where the first spectrum data represent one-dimensional per-wavelength intensity distributions according to the position Y on the monitoring plasma plane MPN in the second horizontal direction Y. An image sensor is an arbitrary device capable of capturing a two-dimensional image. As illustrated in FIG. 11, columns of the two-dimensional image correspond to spectrum components, i.e., wavelengths of the diffraction beams, and rows of the two-dimensional image correspond to intensity distribution according to the horizontal position of each wavelength.

The second beam receptor 310 may include a second lens unit configured to concentrate the second incident beam BY and a second filter having a slit to pass the second line beam LBY among a concentrated beam from the second lens unit.

The second splitter 320 may split the second line beam LBY to generate the third split line beam LBY1 and the fourth split line beam LBY2. As described above, the second splitter 320 may be implemented as a beam splitter.

The second one-dimensional detector 330 may generate the second intensity data based on the third split line beam LBY1, where the second intensity data represent one-dimensional entire intensity distribution according to the position X on the monitoring plasma plane MPN in the first horizontal direction X. As described above, the second one-dimensional detector 330 may include a line sensor.

The second two-dimensional detector 440 may include a second diffraction grating and a second image sensor. The second diffraction grating may divide the fourth split line beam LBY2 to generate second per-wavelength diffraction beams. The second image sensor may generate the second spectrum data based on the second per-wavelength diffraction beams, where the second spectrum data represent one-dimensional per-wavelength intensity distributions according to the position X on the monitoring plasma plane MPN in the first horizontal direction X.

Figure 10:
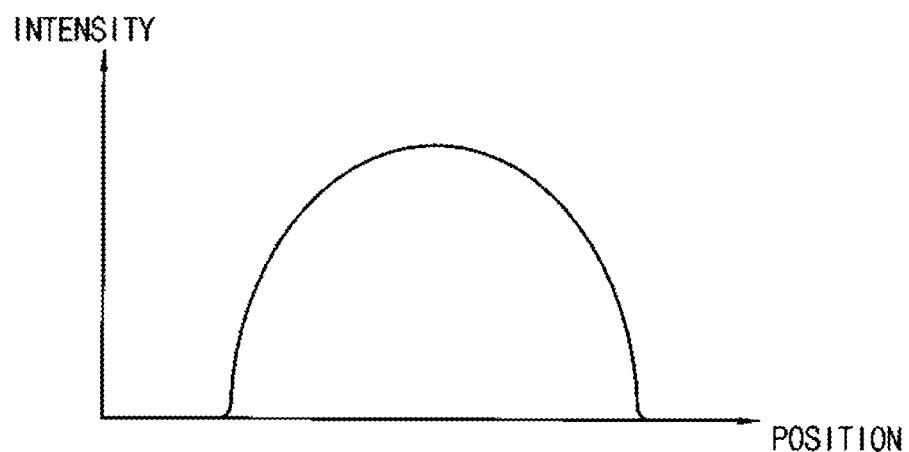
FIG. 10 illustrates a diagram of an example of intensity data generated by a one-dimensional detector included in a plasma sensing device according to example embodiments.
Figure 12:
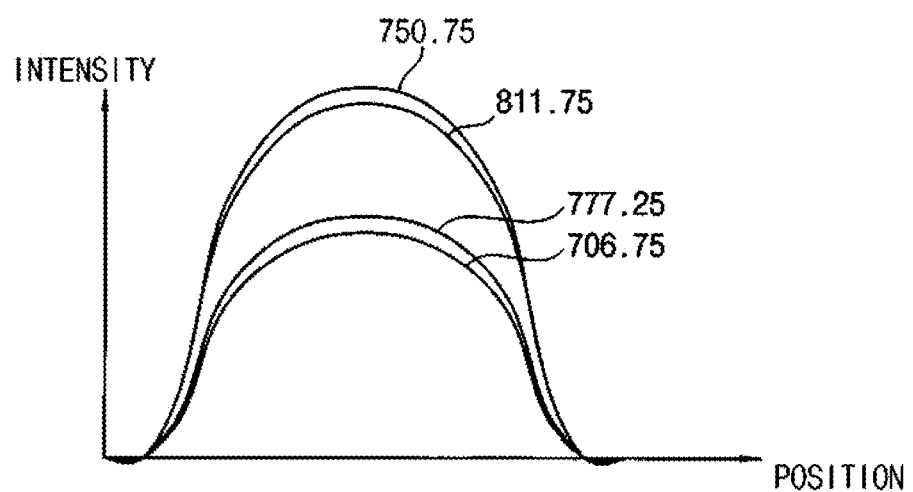
FIG. 12 illustrates a diagram of an example of spectrum data generated by a two-dimensional detector included in a plasma sensing device according to example embodiments.

FIG. 10 illustrates an example of intensity data generated by a one-dimensional detector included in a plasma sensing device according to example embodiments. FIG. 11 illustrates an example of a spectrum image generated by a two-dimensional detector included in a plasma sensing device according to example embodiments. FIG. 12 illustrates an example of spectrum data generated by a two-dimensional detector included in a plasma sensing device according to example embodiments.

FIG. 10 illustrates example intensity data of a plasma state of the monitoring plasma plane MPN. The intensity data represents one-dimensional entire intensity distribution according to each of the position in the second horizontal direction Y and the position in the first horizontal direction X on the monitoring plasma plane MPN.

FIG. 11 illustrates an example image captured by an image sensor included in the two-dimensional detector. The horizontal lines in FIG. 11 correspond to wavelengths of plasma on the monitoring plasma plane MPN. In other words, the horizontal lines in FIG. 11 correspond to per-wavelength intensity distribution according to each of the position in the second horizontal direction Y and the position in the first horizontal direction X on the monitoring plasma plane MPN.

FIG. 12 illustrates the spectrum data of four main peak wavelengths. In FIGS. 12, 706.75, 750.75, 777.25 and 811.75 indicate wavelength in nanometer (nm) of example four main gas species. In other words, the spectrum data of FIG. 12 represent the per-wavelength intensity distribution according to each of the position in the second horizontal direction Y and the position in the first horizontal direction X on the monitoring plasma plane MPN.

In the optical simulation, radiometry based on the entire intensity of the incident beams and/or photometry based on color distribution depending on wavelengths of the incident beam may be used to analyze characteristics of the incident beam. The result of the radiometry and/or the photometry may be obtained depending on fluxes of the gas species.

Figure 13:
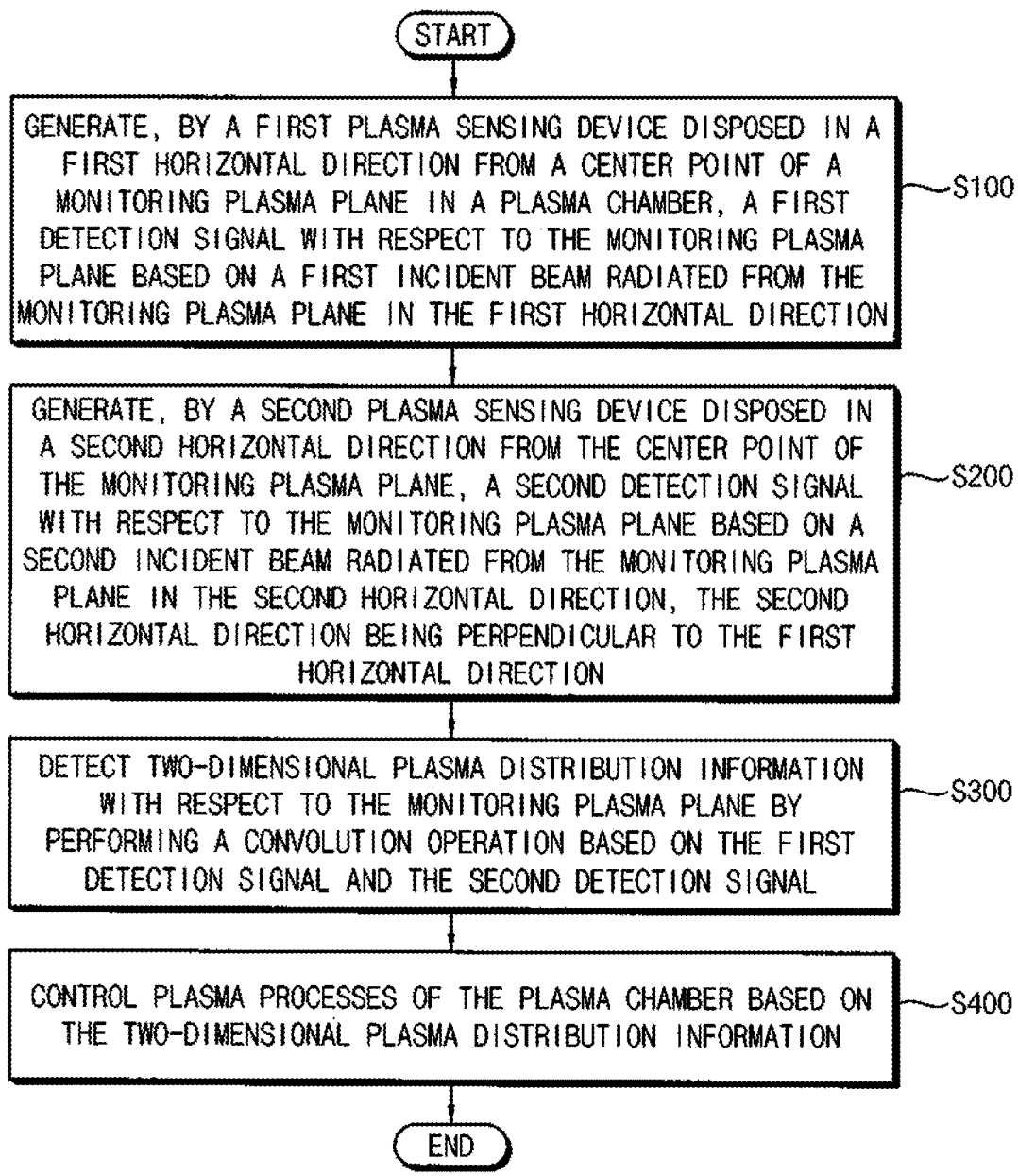
FIG. 13 illustrates a flow chart of a method of controlling plasma processes according to example embodiments.

FIG. 13 is a flow chart illustrating a method of controlling plasma processes according to example embodiments.

Referring to FIG. 13, the first plasma sensing device 200 in the first horizontal direction X from the center point CP of the monitoring plasma plane MPN in the plasma chamber 100 generates the first detection signal PDI1 with respect to the monitoring plasma plane MPN based on the first incident beam BX radiated from the monitoring plasma plane MPN in the first horizontal direction X (S100).

The second plasma sensing device 300 in the second horizontal direction Y from the center point CP of the monitoring plasma plane MPN generates the second detection signal PDI2 with respect to the monitoring plasma plane MPN based on the second incident beam BY radiated from the monitoring plasma plane MPN in the second horizontal direction Y, where the second horizontal direction Y is perpendicular to the first horizontal direction X (S200).

The two-dimensional plasma distribution information with respect to the monitoring plasma plane MPN may be detected by performing a convolution operation based on the first detection signal PDI1 and the second detection signal PDI2 (S300). The convolution operation is disclosed with reference to FIGS. 16 to 18.

The plasma processes of the plasma chamber 100 may be controlled based on the two-dimensional plasma distribution information (S400).

Figure 14:
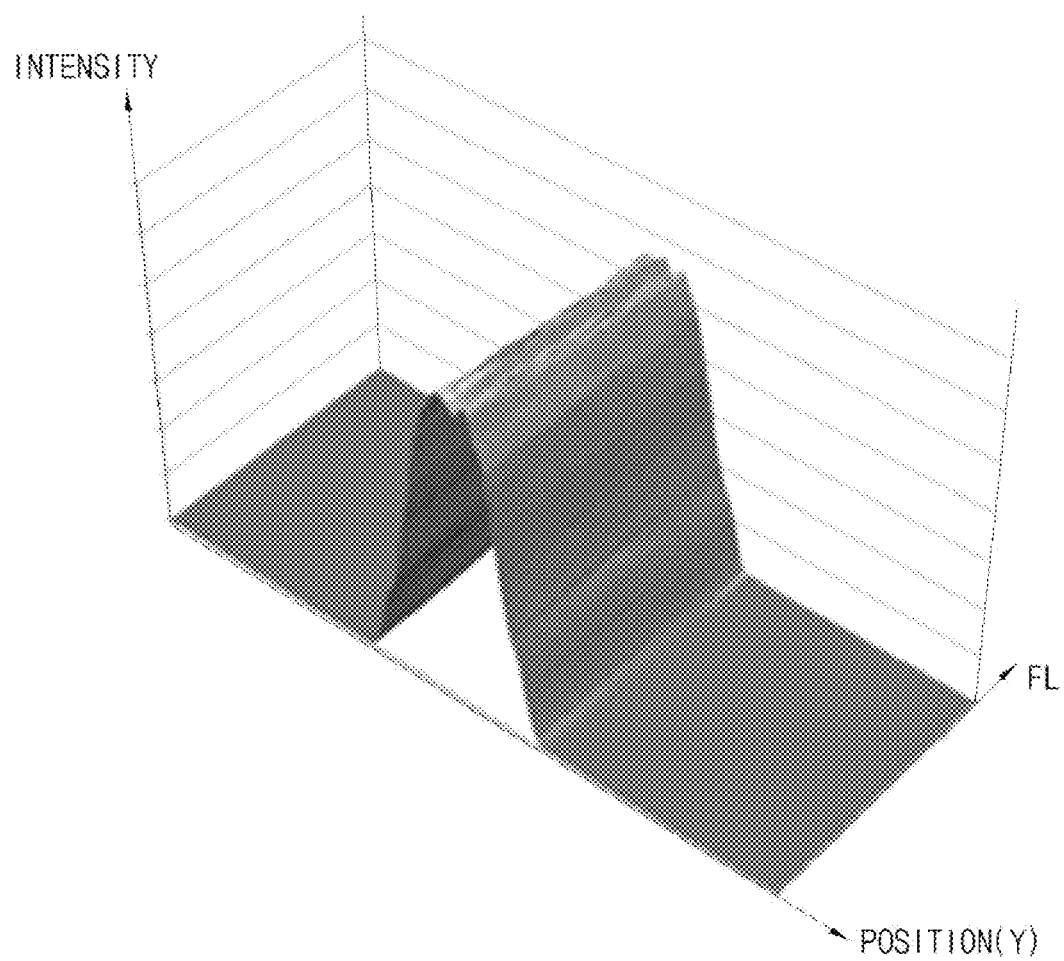
FIGS. 14 and 15 illustrate diagrams of examples of intensity data generated by a one-dimensional detector included in a plasma sensing device according to example embodiments.
Figure 15:
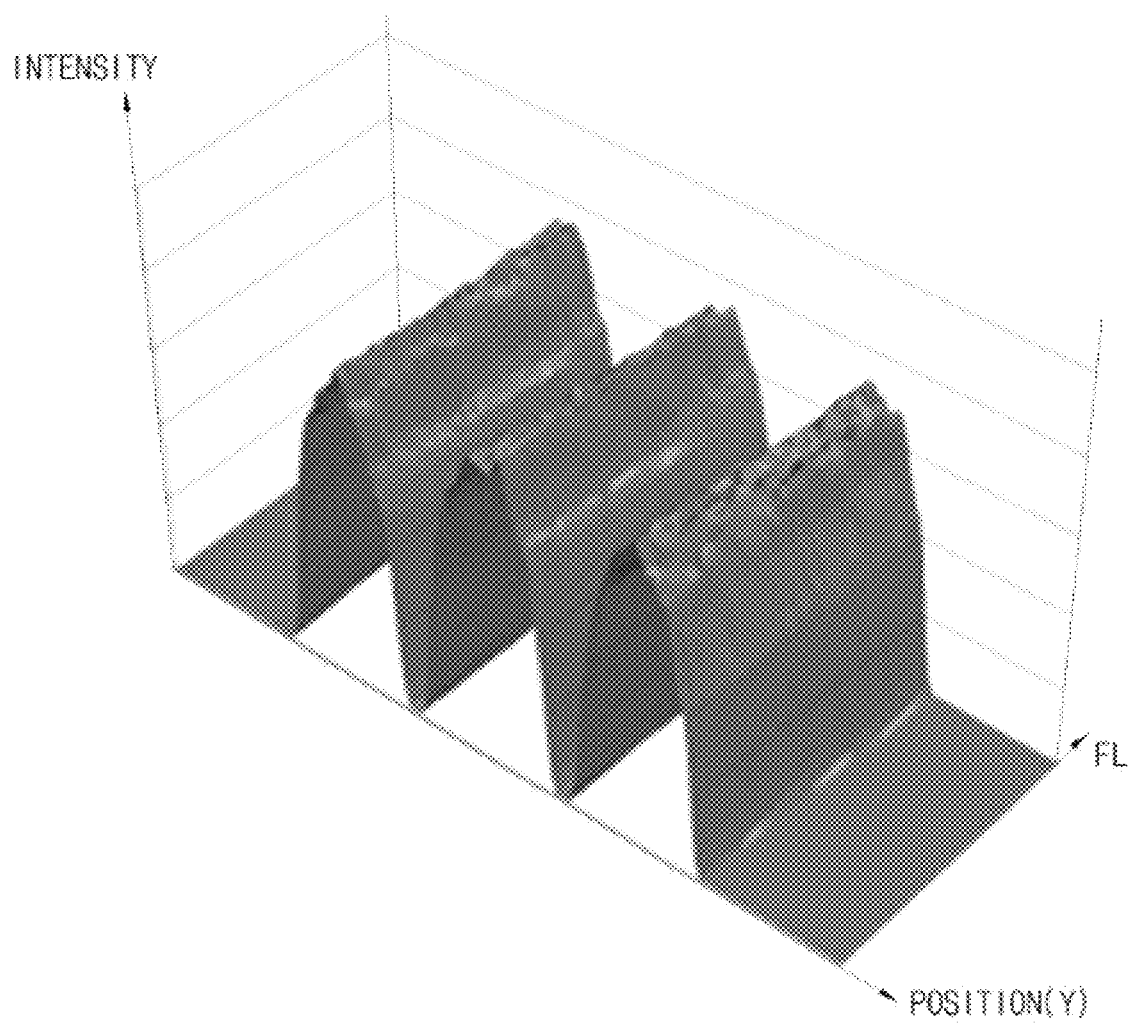

FIGS. 14 and 15 are diagrams illustrating examples of intensity data generated by a one-dimensional detector included in a plasma sensing device according to example embodiments. FIG. 14 illustrates an example of the first intensity data representing one-dimensional entire intensity distribution according to the position Y on the monitoring plasma plane MPN in the second horizontal direction Y. FIG. 15 illustrates an example of the second intensity data representing one-dimensional entire intensity distribution according to the position X on the monitoring plasma plane MPN in the first horizontal direction X. In addition, FIGS. 14 and 15 illustrate the intensity distributions along a focal line (FL) of the above-described first beam receptor unit 210.

Figure 16:
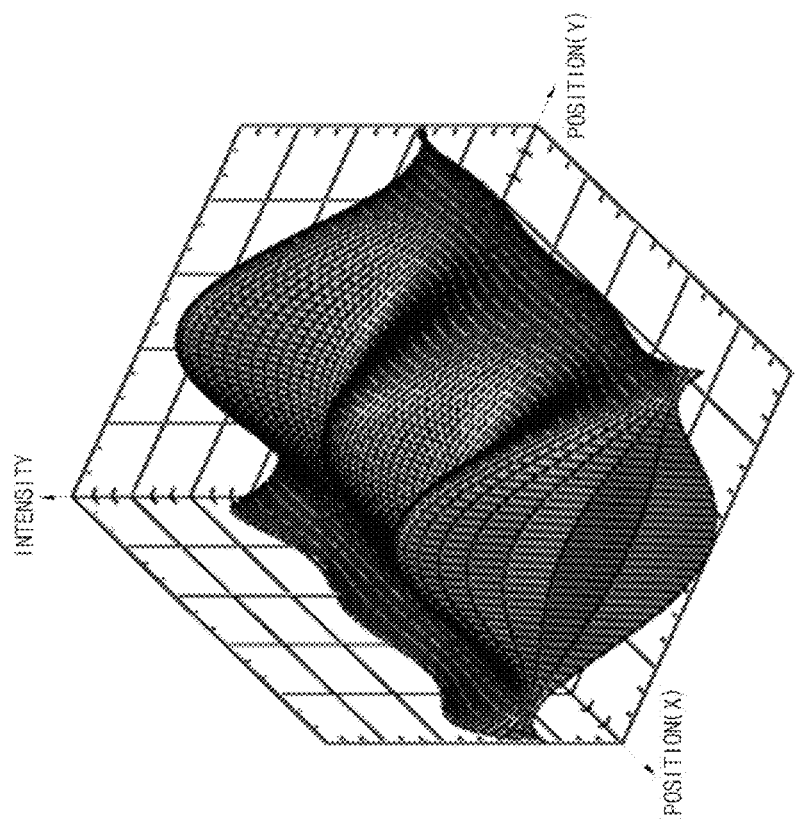
FIG. 16 illustrates a diagram of a two-dimensional plasma distribution by a convolution operation based on the data of FIGS. 14 and 15.

FIG. 16 is a diagram illustrating a two-dimensional plasma distribution by a convolution operation based on the data of FIGS. 14 and 15. The first intensity data of FIG. 14 and the second intensity data of FIG. 15 may be expressed by a function f and a function g, respectively. The functions f and g may be transformed into function $F(x)$ and $G(x)$ through characteristic parameter transformation. When the convolution operation on the functions $F(x)$ and $G(x)$ is performed using the orthogonality of the functions $F(x)$ and $G(x)$, the two-dimensional plasma distribution of the monitoring plasma plane MPN may be obtained.

As described above, the first detection signal PDI1 may include the first intensity data representing the one-dimensional entire intensity distribution according to the position Y on the monitoring plasma plane MPN in the second horizontal direction Y, and the second detection signal PDI2 may include the second intensity data representing one-dimensional entire intensity distribution according to the position X on the monitoring plasma plane MPN in the first horizontal direction X. In this case, the controller 400 may generate the two-dimensional entire intensity distribution of entire gas species in the monitoring plasma plane MPN as illustrated in FIG. 16 by performing a convolution operation based on the first intensity data of FIG. 14 and the second intensity data of FIG. 15.

Figure 17A:
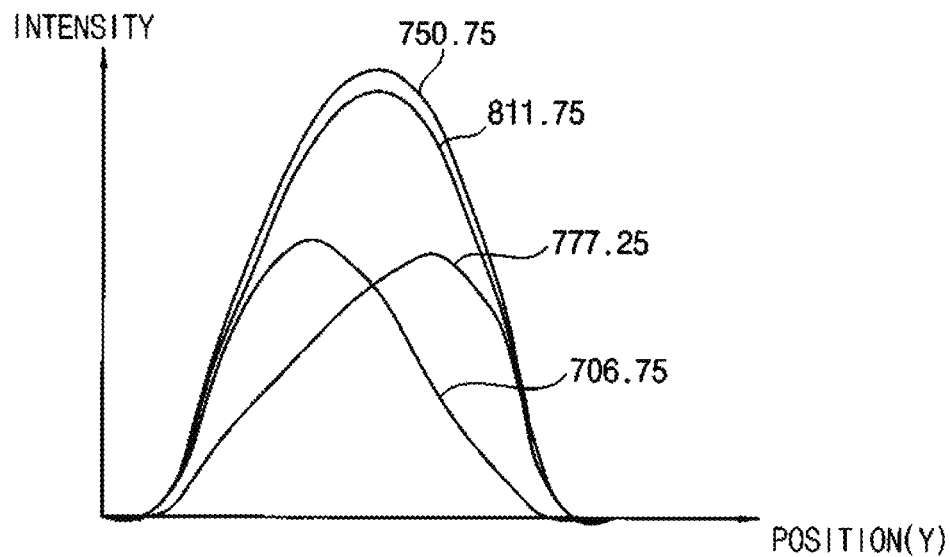
FIGS. 17A and 17B illustrate diagrams of examples of spectrum data generated by a two-dimensional detector included in a plasma sensing device according to example embodiments.
Figure 17B:
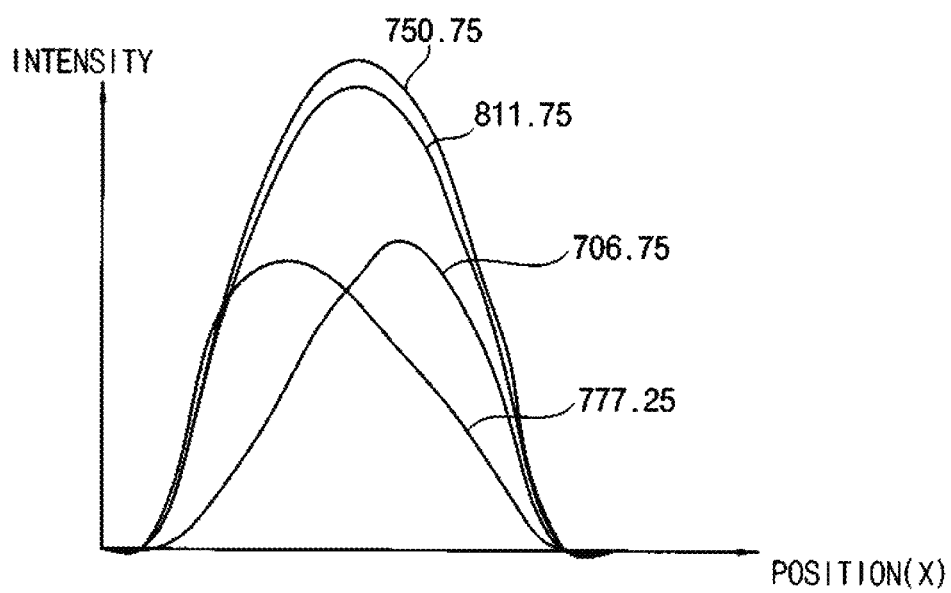

FIGS. 17A and 17B are diagrams illustrating examples of spectrum data generated by a two-dimensional detector included in a plasma sensing device according to example embodiments. FIG. 17A illustrates an example of the first spectrum data representing the one-dimensional per-wavelength intensity distributions according to the position Y on the monitoring plasma plane MPN in the second horizontal direction Y. FIG. 17B illustrates an example of the second spectrum data representing one-dimensional per-wavelength intensity distributions according to the position X on the monitoring plasma plane MPN in the first horizontal direction X. In FIGS. 17A and 17B, 706.75, 750.75, 777.25 and 811.75 indicate wavelength in nanometer (nm) of example four main gas species.

Figure 18:
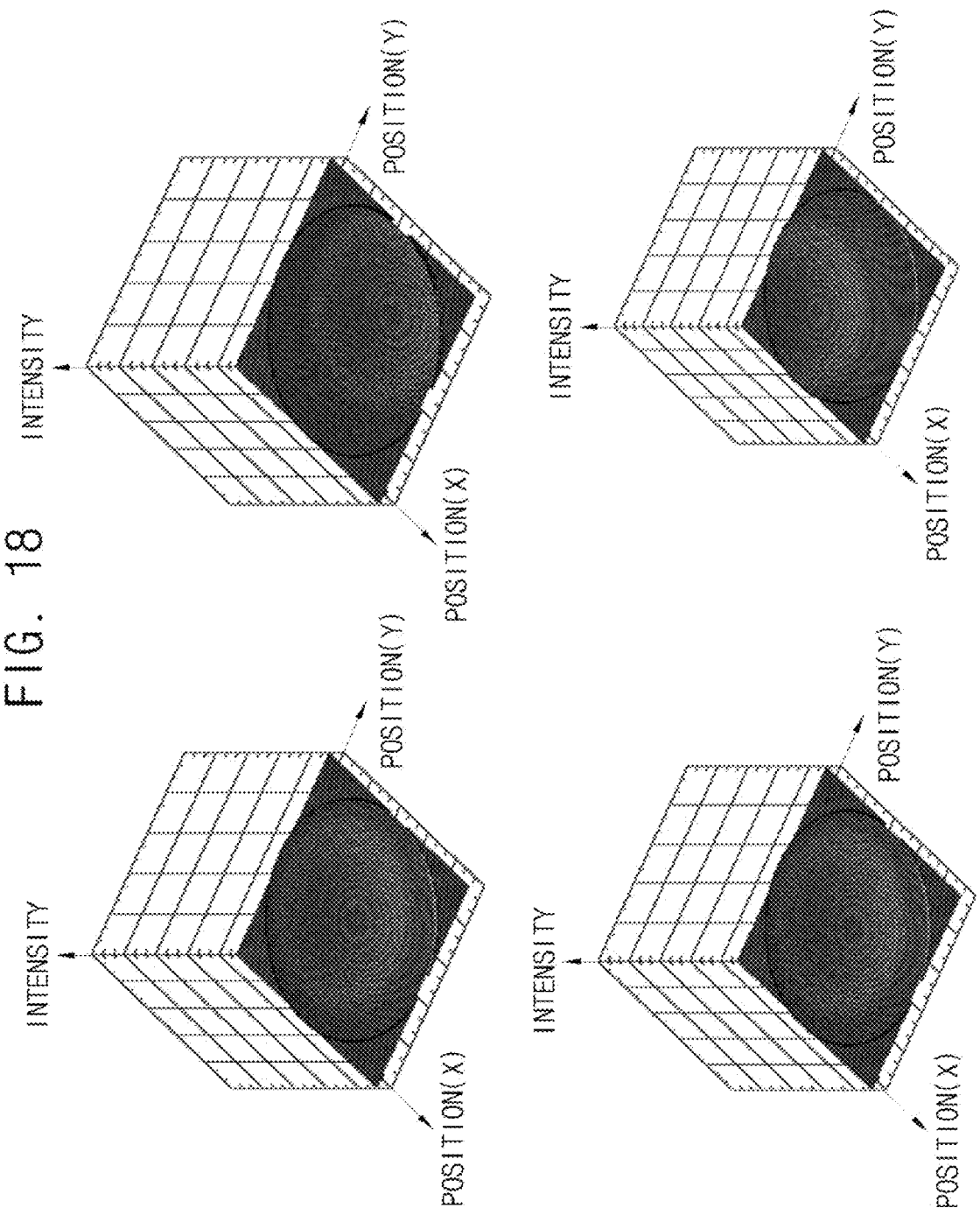
FIG. 18 illustrates a diagram of a two-dimensional plasma distribution by a convolution operation based on the data of FIGS. 17A and 17B.

FIG. 18 is a diagram illustrating a two-dimensional plasma distribution by a convolution operation based on the data of FIGS. 17A and 17B. In the same way as the convolution operation of the intensity data, the first spectrum data of FIG. 17A and the second spectrum data of FIG. 17B may be expressed by a function f and a function g, respectively. The functions f and g may be transformed into function $F(x)$ and $G(x)$ through characteristic parameter transformation. When the convolution operation on the functions $F(x)$ and $G(x)$ is performed using the orthogonality of the functions $F(x)$ and $G(x)$, the two-dimensional per-wavelength intensity distributions of the monitoring plasma plane MPN may be obtained.

As described above, the first detection signal PDI1 may include the first spectrum data representing one-dimensional per-wavelength intensity distributions according to the position Y on the monitoring plasma plane MPN in the second horizontal direction Y, and the second detection signal PDI2 may include the second spectrum data representing one-dimensional per-wavelength intensity distributions according to the position X on the monitoring plasma plane MPN in the first horizontal direction X. In this case, the controller 400 may generate the two-dimensional per-wavelength intensity distributions of respective gas species in the monitoring plasma plane MPN as illustrated in FIG. 18 by performing the convolution operation based on the first spectrum data of FIG. 17A and the second spectrum data of FIG. 17B.

Figure 19:
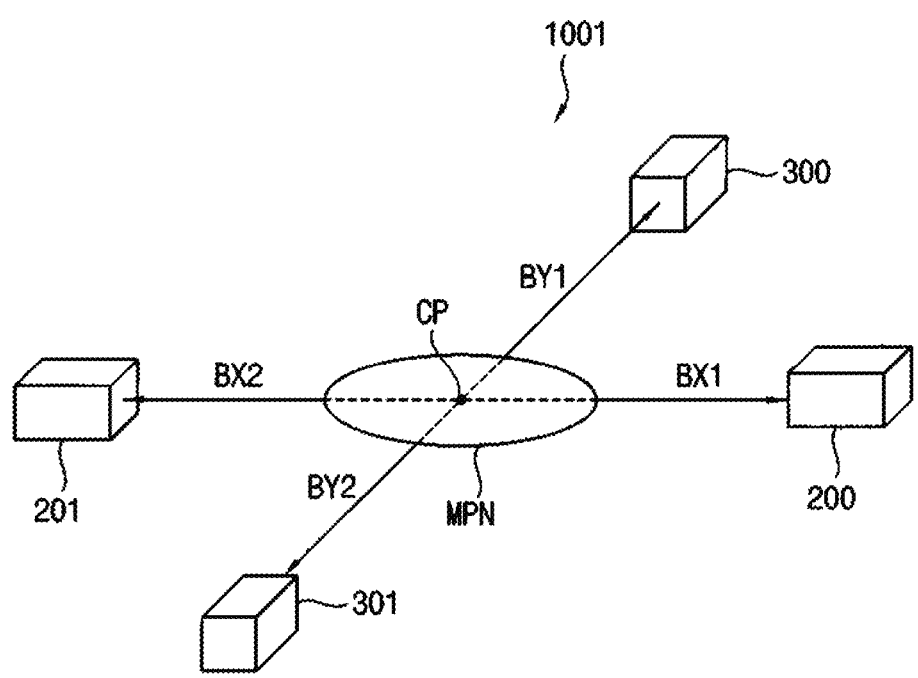
FIGS. 19, 20, and 21 illustrate perspective views of a plasma monitoring system according to example embodiments.

FIG. 19 is a perspective view of a plasma monitoring system according to example embodiments. For convenience of illustration, components other than plasma sensing devices are omitted in FIG. 19.

Referring to FIG. 19, a plasma monitoring system 1001 may include the first plasma sensing device 200, the second plasma sensing device 300, a third plasma sensing device 201, and a fourth plasma sensing device 301.

The first plasma sensing device 200 is disposed in a first horizontal direction X from a center point CP of a monitoring plasma plane MPN in the plasma chamber 100, and the second plasma sensing device 300 is disposed in a second horizontal direction Y from the center point CP of the monitoring plasma plane MPN. In other words, the first plasma sensing device 200 and the second plasma sensing device are at locations perpendicular to each other from the center point CP of the monitoring plasma plane MPN. The viewing windows VW1 and VW2 may be provided at the perpendicular locations.

The third plasma sensing device 201 is in an opposite direction −X of the first horizontal direction X from the center point CP of the monitoring plasma plane MPN in the plasma chamber 100, and the fourth plasma sensing device 301 is in an opposite direction −Y of the second horizontal direction Y from the center point CP of the monitoring plasma plane MPN. In other words, the third plasma sensing device 201 and the fourth plasma sensing device 301 are at locations perpendicular to each other from the center point CP of the monitoring plasma plane MPN.

All of the first plasma sensing device 200, the second plasma sensing device 300, the third plasma sensing device 201, and the fourth plasma sensing device 301 are at the same level in the vertical direction Z as the monitoring plasma plane MPN.

The first plasma sensing device 200 generates a first detection signal with respect to the monitoring plasma plane MPN based on a first incident beam BX1 radiated from the monitoring plasma plane MPN in the first horizontal direction X. The first detection signal may represent a one-dimensional plasma distribution according to a position Y on the monitoring plasma plane MPN in the second horizontal direction Y.

The second plasma sensing device 300 generates a second detection signal with respect to the monitoring plasma plane MPN based on a second incident beam BY1 radiated from the monitoring plasma plane MPN in the second horizontal direction Y. The second detection signal may represent a one-dimensional plasma distribution according to a position X on the monitoring plasma plane MPN in the first horizontal direction X.

The third plasma sensing device 201 generates a third detection signal with respect to the monitoring plasma plane MPN based on a third incident beam BX2 radiated from the monitoring plasma plane MPN in the opposite direction −X of the first horizontal direction X. The third detection signal may represent another version of the one-dimensional plasma distribution according to the position Y on the monitoring plasma plane MPN in the second horizontal direction Y.

The fourth plasma sensing device 301 generates a fourth detection signal with respect to the monitoring plasma plane MPN based on a second incident beam BY2 radiated from the monitoring plasma plane MPN in the opposite direction −Y of the second horizontal direction Y. The fourth detection signal may represent another version of the one-dimensional plasma distribution according to the position X on the monitoring plasma plane MPN in the first horizontal direction X.

As a result, the first detection signal and the third detection signal may represent the one-dimensional plasma distribution according to a position Y on the monitoring plasma plane MPN in the second horizontal direction Y, and the second detection signal and the fourth detection signal may represent the one-dimensional plasma distribution according to a position X on the monitoring plasma plane MPN in the first horizontal direction X. Using two detection signals for each direction, further accurate one-dimensional plasma distribution may be obtained.

The controller 400 of FIG. 1 may detect one-dimensional plasma distribution according to the position on the monitoring plasma plane MPN in the second direction Y based on the first detection signal and the third detection signals. In addition, the controller 400 may detect one-dimensional plasma distribution according to the position X on the monitoring plasma plane MPN in the first direction X based on the second detection signal and the fourth detection signals.

Figure 20:
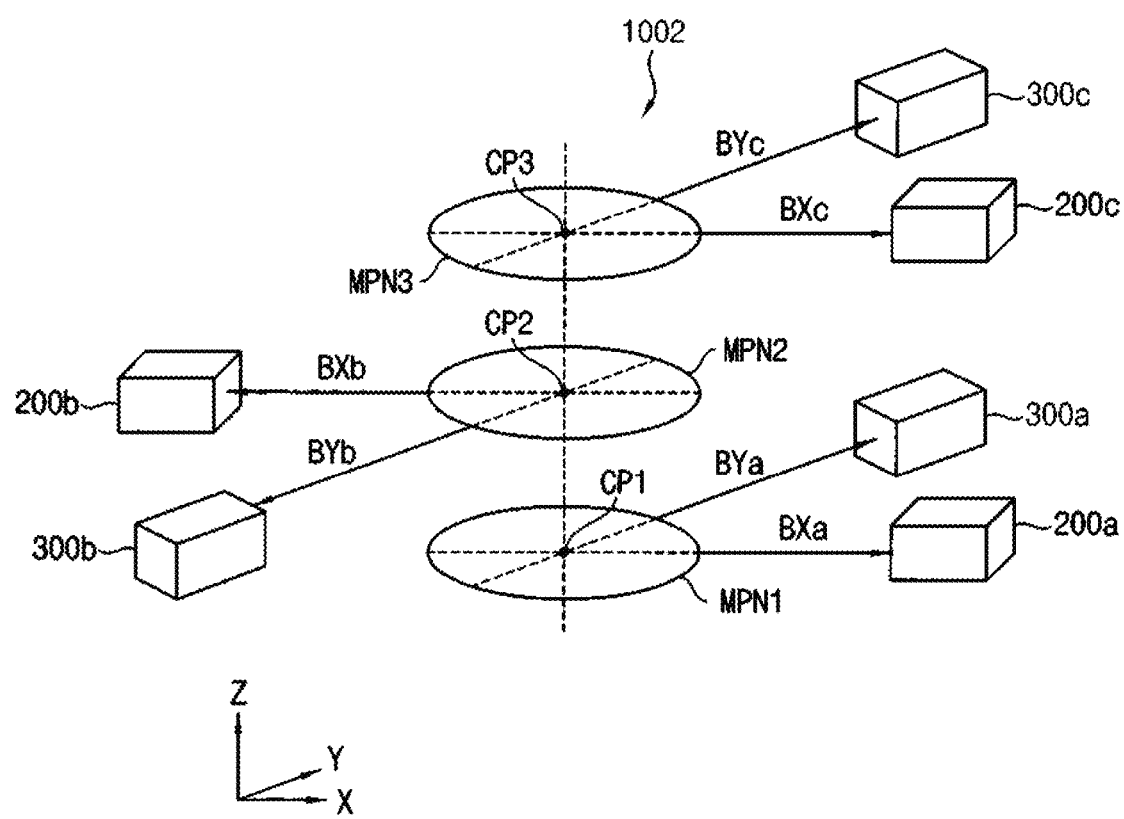
Figure 21:
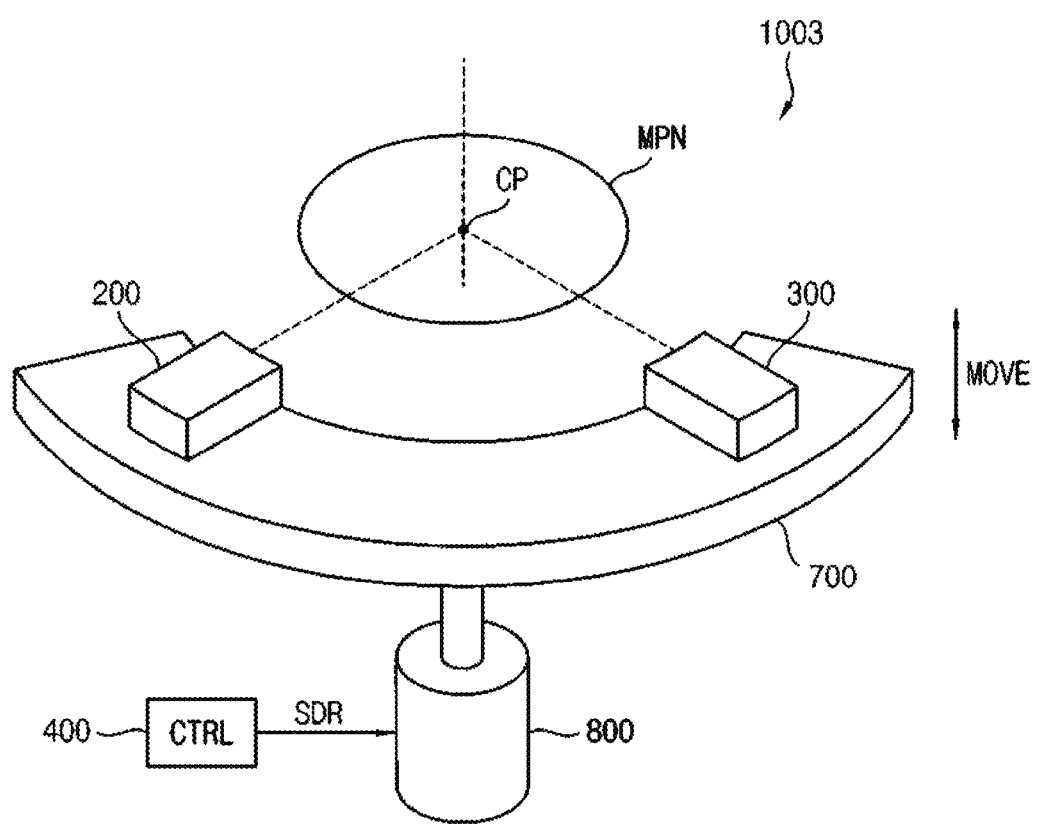

Hereinafter, example embodiments of a plasma monitoring system for detecting three-dimensional plasma distribution information are described. FIGS. 20 and 21 are perspective views of a plasma monitoring system according to example embodiments. For convenience of illustration, components other than plasma sensing devices are omitted in FIGS. 20 and 21.

Referring to FIG. 20, a plasma monitoring system 1002 may include a first plasma sensing device 200*a*, a second plasma sensing device 300*a*, a third plasma sensing device 200*b*, a fourth plasma sensing device 300*b*, a fifth plasma sensing device 200*c*, and a sixth plasma sensing device 300*c*. In FIG. 20, a first monitoring plasma plane MPN1, a second monitoring plasma plane MPN2, and a third monitoring plasma plane MPN3 have the different levels in the vertical direction Z.

The first plasma sensing device 200*a* generates a first detection signal with respect to the first monitoring plasma plane MPN1 based on a first incident beam BXa radiated from the first monitoring plasma plane MPN1 in the first horizontal direction X. The first detection signal may represent a one-dimensional plasma distribution according to the position Y on the first monitoring plasma plane MPN1 in the second horizontal direction Y.

The second plasma sensing device 300*a* generates a second detection signal with respect to the first monitoring plasma plane MPN1 based on a second incident beam BYa radiated from the first monitoring plasma plane MPN1 in the second horizontal direction Y. The second detection signal may represent a one-dimensional plasma distribution according to the position X on the first monitoring plasma plane MPN1 in the first horizontal direction X.

The third plasma sensing device 200*b* generates a third detection signal with respect to the second monitoring plasma plane MPN2 based on a third incident beam BXb radiated from the second monitoring plasma plane MPN2 in the opposite direction −X of the first horizontal direction X. The third detection signal may represent a one-dimensional plasma distribution according to the position Y on the second monitoring plasma plane MPN2 in the second horizontal direction Y.

The fourth plasma sensing device 300*b* generates a fourth detection signal with respect to the second monitoring plasma plane MPN2 based on a fourth incident beam BYb radiated from the second monitoring plasma plane MPN2 in the opposite direction −Y of the second horizontal direction Y. The fourth detection signal may represent a one-dimensional plasma distribution according to the position X on the second monitoring plasma plane MPN2 in the first horizontal direction X.

The fifth plasma sensing device 200*c* generates a fifth detection signal with respect to the third monitoring plasma plane MPN3 based on a fifth incident beam BXc radiated from the third monitoring plasma plane MPN1 in the first horizontal direction X. The fifth detection signal may represent a one-dimensional plasma distribution according to the position Y on the third monitoring plasma plane MPN3 in the second horizontal direction Y.

The sixth plasma sensing device 300*c* generates a sixth detection signal with respect to the third monitoring plasma plane MPN3 based on a sixth incident beam BYc radiated from the third monitoring plasma plane MPN3 in the second horizontal direction Y. The sixth detection signal may represent a one-dimensional plasma distribution according to the position X on the third monitoring plasma plane MPN3 in the first horizontal direction X.

FIG. 20 illustrates that the first monitoring plasma plane MPN1, the second plasma sensing device 300*a*, the third plasma sensing device 200*b*, the fourth plasma sensing device 300*b*, the fifth plasma sensing device 200*c*, and the sixth plasma sensing device 300*c* are disposed in the first horizontal direction X, the second horizontal direction Y, the opposite direction −X of the first horizontal direction X and the opposite direction −Y of the second horizontal direction Y. Alternatively, just having two plasma sensing devices in perpendicular directions may be sufficient.

The controller 400 of FIG. 1 may detect two-dimensional plasma distribution information with respect to the first monitoring plasma plane MPN1 by performing a convolution operation on the first detection signal and the second detection signal. In addition, the controller 400 may detect two-dimensional plasma distribution information with respect to the second monitoring plasma plane MPN2 by performing a convolution operation on the third detection signal and the fourth detection signal. In addition, the controller 400 may detect two-dimensional plasma distribution information with respect to the third monitoring plasma plane MPN3 by performing a convolution operation on the fifth detection signal and the sixth detection signal. The two-dimensional plasma distribution information with respect to two or more monitoring plasma plane MPN1, MPN2, and MPN3 may correspond to three-dimensional plasma distribution information.

As a result, the controller 400 may detect the three-dimensional plasma distribution information and control the plasma processed of the plasma chamber 100 based on the three-dimensional plasma distribution information.

Referring to FIG. 21, a plasma monitoring system 1003 may include the first plasma sensing device 200, the second plasma sensing device 300, a mounting device 700, and an actuator 800.

The first plasma sensing device 200 is in a first horizontal direction X from a center point CP of a monitoring plasma plane MPN in the plasma chamber 100. The second plasma sensing device 300 is in a second horizontal direction Y from the center point CP of the monitoring plasma plane MPN. In other words, the first plasma sensing device 200 and the second plasma sensing device 300 are at locations perpendicular to each other from the center point CP of the monitoring plasma plane MPN.

The first plasma sensing device 200 generates a first detection signal with respect to the monitoring plasma plane MPN based on a first incident beam radiated from the monitoring plasma plane MPN in the first horizontal direction X. The first detection signal may represent a one-dimensional plasma distribution according to a position Y on the monitoring plasma plane MPN in the second horizontal direction Y.

The second plasma sensing device 300 generates a second detection signal with respect to the monitoring plasma plane MPN based on a second incident beam radiated from the monitoring plasma plane MPN in the second horizontal direction Y. The second detection signal may represent a one-dimensional plasma distribution according to a position X on the monitoring plasma plane MPN in the first horizontal direction X.

The first plasma sensing device 200 and the second plasma sensing device 300 are attached to the mounting device 700. The actuator 800 controls a vertical position of the mounting device 700 to sequentially change a vertical level of the monitoring plasma plane MPN to be monitored by the first plasma sensing device 200 and the second plasma sensing device. For example, the actuator 800 may determine an amount of a change of the vertical position of the mounting device 700 and a timing of the change based on a driving signal SDR provided from the controller 400. According to example embodiments, the actuator 800 may rotate the mounting device 700 around a vertical axis penetrate the center point CP of the monitoring plasma plane MPN.

The controller 400 may detect three-dimensional plasma distribution information with respect to the plasma space in the plasma chamber 100 by performing the convolution operation multiple times based on the first detection signal and the second detection signal corresponding to the sequentially changed vertical level of the monitoring plasma plane MPN, and control the plasma processes based on the three-dimensional plasma distribution information.

Embodiments may be applied to manufacturing processes of semiconductor integrated circuits. For example, embodiments may be applied to systems and manufacturing processes of the systems such as be a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

Embodiments are described, and illustrated in the drawings, in terms of functional blocks, units, modules, and/or methods. Those skilled in the art will appreciate that these blocks, units, modules, and/or methods are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units, modules, and/or methods being implemented by microprocessors or similar, they may be programmed using software (e.g., microcode) to perform various functions discussed herein and may optionally be driven by firmware and/or software. Alternatively, each block, unit, module, and/or method may be implemented by dedicated hardware, or as a combination of dedicated hardware to perform some functions and a processor (e.g., one or more programmed microprocessors and associated circuitry) to perform other functions. Also, each block, unit, and/or module of the embodiments may be physically separated into two or more interacting and discrete blocks, units and/or modules without departing from the scope of the disclosure. Further, the blocks, units and/or modules of the embodiments may be physically combined into more complex blocks, units and/or modules without departing from the scope of the disclosure.

As described above, the plasma sensing device, the plasma monitoring system including the plasma sensing device, and the method of controlling plasma processes according to example embodiments may enhance productivity of the plasma processes by providing two-dimensional or three-dimensional plasma distribution information in real time using orthogonality of the detection signals.

Some example embodiments may provide a plasma sensing device and a plasma monitoring system capable of detecting a plasma state in a plasma chamber accurately and efficiently. Some example embodiments may provide a method of controlling plasma processes based on accurate and efficient detection of a plasma state in a plasma chamber.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A plasma monitoring system, comprising:
    a plasma chamber to perform plasma processes;
    a first plasma sensing device in a first horizontal direction from a center point of a monitoring plasma plane in the plasma chamber, the first plasma sensing device to generate a first detection signal with respect to the monitoring plasma plane based on a first incident beam radiated from the monitoring plasma plane in the first horizontal direction;
    a second plasma sensing device in a second horizontal direction from the center point of the monitoring plasma plane, the second horizontal direction being perpendicular to the first horizontal direction, the second plasma sensing device to generate a second detection signal with respect to the monitoring plasma plane based on a second incident beam radiated from the monitoring plasma plane in the second horizontal direction; and
    a controller to detect two-dimensional plasma distribution information with respect to the monitoring plasma plane by performing a convolution operation based on the first detection signal and the second detection signal, and to control the plasma processes based on the two-dimensional plasma distribution information,
    wherein the first plasma sensing device includes:
        a first splitter to split a first line beam corresponding to the monitoring plasma plane to generate a first split line beam and a second split line beam,
        a first one-dimensional detector to generate first intensity data based on the first split line beam, the first intensity data representing one-dimensional entire intensity distribution according to a position on the monitoring plasma plane in the second horizontal direction, and
        a first two-dimensional detector to generate first spectrum data based on the second split line beam, the first spectrum data representing one-dimensional per-wavelength intensity distributions according to the position on the monitoring plasma plane in the second horizontal direction.

2. The plasma monitoring system as claimed in claim 1, wherein the first detection signal represents a one-dimensional plasma distribution in the second horizontal direction of the monitoring plasma plane, and the second detection signal represents a one-dimensional plasma distribution in the first horizontal direction of the monitoring plasma plane.

3. The plasma monitoring system as claimed in claim 1, wherein:
    the first detection signal includes the first intensity data and the first spectrum data, and
    the second detection signal includes:
        second intensity data representing one-dimensional entire intensity distribution according to the position on the monitoring plasma plane in the first horizontal direction; and
        second spectrum data representing one-dimensional per-wavelength intensity distributions according to the position on the monitoring plasma plane in the first horizontal direction.

4. The plasma monitoring system as claimed in claim 1, wherein the first plasma sensing device further includes:
    a beam receptor to filter the first incident beam to generate the first line beam corresponding to the monitoring plasma plane;
    a first diffraction grating in the first two-dimensional detector to divide the second split line beams to generate per-wavelength diffraction beams; and
    a first image sensor in the first two-dimensional detector to generate the first spectrum data based on the per-wavelength diffraction beams.

5. The plasma monitoring system as claimed in claim 1, wherein:
    the first detection signal includes the first intensity data,
    the second detection signal includes second intensity data representing one-dimensional entire intensity distribution according to a position on the monitoring plasma plane in the first horizontal direction, and
    the controller generates, as the two-dimensional plasma distribution information, two-dimensional entire intensity distribution of entire gas species in the monitoring plasma plane by performing a convolution operation based on the first intensity data and the second intensity data.

6. The plasma monitoring system as claimed in claim 1, wherein:
    the first detection signal includes the first spectrum data,
    the second detection signal includes second spectrum data representing one-dimensional per-wavelength intensity distributions according to a position on the monitoring plasma plane in the first horizontal direction, and
    the controller generates, as the two-dimensional plasma distribution information, two-dimensional per-wavelength intensity distributions of respective gas species in the monitoring plasma plane by performing a convolution operation based on the first spectrum data and the second spectrum data.

7. The plasma monitoring system as claimed in claim 1, wherein the first plasma sensing device further includes:
    a first beam receptor to filter the first incident beam to generate a first line beam corresponding to the monitoring plasma plane.

8. The plasma monitoring system as claimed in claim 7, wherein the first beam receptor includes;
    a first lens unit to concentrate the first incident beam; and
    a first filter having a slit to pass the first line beam among a concentrated beam from the first lens unit.

9. The plasma monitoring system as claimed in claim 7, wherein the second plasma sensing device includes:
    a second beam receptor to filter the second incident beam to generate a second line beam corresponding to the monitoring plasma plane;
    a second splitter to split the second line beam to generate a third split line beam and a fourth split line beam;
    a second one-dimensional detector to generate second intensity data based on the third split line beam, the second intensity data representing one-dimensional entire intensity distribution according to a position on the monitoring plasma plane in the first horizontal direction; and
    a second two-dimensional detector to generate second spectrum data based on the fourth split line beam, the second spectrum data representing one-dimensional per-wavelength intensity distributions according to the position on the monitoring plasma plane in the first horizontal direction.

10. The plasma monitoring system as claimed in claim 9, wherein the second beam receptor includes;
   a second lens unit to concentrate the second incident beam; and
   a second filter having a slit to pass the second line beam among a concentrated beam from the second lens unit.

11. The plasma monitoring system as claimed in claim 9, wherein the second two-dimensional detector includes:
   a second diffraction grating to divide the fourth split line beam to generate second per-wavelength diffraction beams; and
   a second image sensor to generate second spectrum data based on the second per-wavelength diffraction beams.

12. The plasma monitoring system as claimed in claim 1, further comprising:
   a third plasma sensing device in an opposite direction of the first horizontal direction from the center point of the monitoring plasma plane, and to generate a third detection signal with respect to the monitoring plasma plane based on a third incident beam radiated from the monitoring plasma plane in the opposite direction of the first horizontal direction; and
   a fourth plasma sensing device in an opposite direction of the second horizontal direction from the center point of the monitoring plasma plane, and to generate a fourth detection signal with respect to the monitoring plasma plane based on a fourth incident beam radiated from the monitoring plasma plane in the opposite direction of the second horizontal direction.

13. The plasma monitoring system as claimed in claim 12, wherein the controller detects one-dimensional plasma distribution according to a position on the monitoring plasma plane in the second direction based on the first detection signal and the third detection signals, and detects one-dimensional plasma distribution according to a position on the monitoring plasma plane in the first direction based on the second detection signal and the fourth detection signals.

14. The plasma monitoring system as claimed in claim 1, further comprising:
   a third plasma sensing device in a third direction from a center point of another monitoring plasma plane of a vertical level different from the monitoring plasma plane, and to generate a third detection signal with respect to the another monitoring plasma plane based on a third incident beam radiated from the another monitoring plasma plane in third horizontal direction; and
   a fourth plasma sensing device in a fourth direction from the center point of the another monitoring plasma plane, the fourth horizontal direction being perpendicular to the third horizontal direction, and to generate a fourth detection signal with respect to the another monitoring plasma plane based on a fourth incident beam radiated from the another monitoring plasma plane in the fourth horizontal direction.

15. The plasma monitoring system as claimed in claim 14, wherein the controller detects three-dimensional plasma distribution information with respect to a plasma space in the plasma chamber by performing the convolution operation based on the first detection signal and the second detection signal, and by performing a convolution operation based on the third detection signal and the fourth detection signal, and controls the plasma processes based on the three-dimensional plasma distribution information.

16. The plasma monitoring system as claimed in claim 1, further comprising;
   a mounting device on to which the first plasma sensing device and the second plasma sensing device are attached; and
   an actuator to control a vertical position of the mounting device to sequentially change a vertical level of the monitoring plasma plane.

17. The plasma monitoring system as claimed in claim 16, wherein the controller detects three-dimensional plasma distribution information with respect to a plasma space in the plasma chamber by performing the convolution operation multiple times based on the first detection signal and the second detection signal corresponding to the sequentially changed vertical level of the monitoring plasma plane, and controls the plasma processes based on the three-dimensional plasma distribution information.

18. A plasma sensing device in a first horizontal direction from a center point of a monitoring plasma plane in a plasma chamber, the plasma sensing device comprising:
   a beam receptor to filter an incident beam radiated from the monitoring plasma plane in the first horizontal direction to generate a line beam corresponding to the monitoring plasma plane;
   a splitter to split the line beam to generate two split line beams;
   a one-dimensional detector to generate intensity data based on one of the two split line beams, the intensity data representing one-dimensional entire intensity distribution according to a position on the monitoring plasma plane in a second horizontal direction perpendicular to the first horizontal direction;
   a diffraction grating to divide the other of the two split line beams to generate per-wavelength diffraction beams; and
   an image sensor to generate spectrum data based on the per-wavelength diffraction beams, the spectrum data representing one-dimensional per-wavelength intensity distributions according to the position on the monitoring plasma plane in the second horizontal direction.

19. A method of controlling plasma processes, the method comprising:
   generating by a first plasma sensing device a first detection signal with respect to a first horizontal direction from a center point of a monitoring plasma plane based on a first incident beam radiated from the monitoring plasma plane in the first horizontal direction;
   generating by a second plasma sensing device a second detection signal with respect to a second horizontal direction from the center point of the monitoring plasma plane based on a second incident beam radiated from the monitoring plasma plane in the second horizontal direction, the second horizontal direction being perpendicular to the first horizontal direction;
   detecting two-dimensional plasma distribution information with respect to the monitoring plasma plane by performing a convolution operation based on the first detection signal and the second detection signal; and
   controlling plasma processes of a plasma chamber based on the two-dimensional plasma distribution information,
   wherein each of the first and second plasma sensing devices includes:
      a splitter to split a first line beam corresponding to the monitoring plasma plane to generate a first split line beam and a second split line beam, a one-dimensional detector to generate first intensity data based on the first split line beam, the first intensity data representing one-dimensional entire intensity distribution according to a position on the monitoring plasma plane in a respective one of the first and second horizontal directions, and a two-dimensional detector to generate first spectrum data based on the second split line beam, the first spectrum data representing one-dimensional per-wavelength intensity distributions according to the position on the monitoring plasma plane in a respective one of the first and second horizontal directions.

\* \* \* \* \*